(12) United States Patent
Chen et al.

(10) Patent No.: US 8,749,016 B2
(45) Date of Patent: Jun. 10, 2014

(54) HIGH VOLTAGE MOS DEVICE AND METHOD FOR MAKING THE SAME

(75) Inventors: Chieh-Chih Chen, Hsinchu County (TW); Cheng-Chi Lin, Toechen Township, Yilan County (TW); Chen-Yuan Lin, Taitung (TW); Shih-Chin Lien, Sinjhuang (TW); Shyi-Yuan Wu, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 240 days.

(21) Appl. No.: 12/899,152

(22) Filed: Oct. 6, 2010

(65) Prior Publication Data

US 2012/0086052 A1    Apr. 12, 2012

(51) Int. Cl.
*H01L 29/06* (2006.01)

(52) U.S. Cl.
USPC .............. 257/487; 257/355; 257/E29.033; 257/E29.268; 438/286

(58) Field of Classification Search
USPC ............... 257/355, 487, E29.023, E29.268; 438/286
See application file for complete search history.

(56) References Cited

U.S. PATENT DOCUMENTS

| | | | |
|---|---|---|---|
| 6,924,531 B2 * | 8/2005 | Chen et al. | 257/336 |
| 7,161,223 B2 * | 1/2007 | Beasom | 257/493 |
| 7,202,531 B2 * | 4/2007 | Imahashi et al. | 257/355 |
| 7,262,476 B2 * | 8/2007 | Bude et al. | 257/493 |
| 2004/0033666 A1 * | 2/2004 | Williams et al. | 438/297 |
| 2006/0065931 A1 * | 3/2006 | Lee et al. | 257/355 |
| 2007/0246738 A1 * | 10/2007 | Otake | 257/139 |
| 2008/0017948 A1 * | 1/2008 | Huang et al. | 257/487 |

* cited by examiner

*Primary Examiner* — John C Ingham
(74) *Attorney, Agent, or Firm* — Alston & Bird LLP

(57) ABSTRACT

A high-voltage metal-oxide-semiconductor (HVMOS) device may include a source, a drain, a gate positioned proximate to the source, a drift region disposed substantially between the drain and a region of the gate and the source, and a self shielding region disposed proximate to the drain. A corresponding method is also provided.

21 Claims, 37 Drawing Sheets

Profile 2

Profile 4

Profile 1

Profile 2

Profile 3

Profile 4

HIGH VOLTAGE MOS DEVICE AND METHOD FOR MAKING THE SAME

TECHNOLOGICAL FIELD

Embodiments of the present invention generally relate to semiconductor devices and, more particularly, relate to a metal-oxide-semiconductor (MOS) device with an isolated structure for ultra-high-voltage (UHV) operation.

BACKGROUND

There is currently an ongoing drive toward the downscaling of device dimensions in virtually all aspects of electronic device manufacture. Smaller electronic devices tend to be more popular than larger, more bulky devices when both devices have substantially equivalent capabilities. Accordingly, being able to fabricate smaller components would clearly tend to facilitate the production of smaller devices that incorporate those components. However, many modern electronic devices require electronic circuitry to perform both actuation functions (e.g., switching devices) and data processing or other decision making functions. The use of low-voltage complementary metal-oxide-semiconductor (CMOS) technologies for these dual functions may not be practical. Thus, high-voltage integrated circuits (HVIC) or power-integrated circuits (PIC) have been developed to attempt to integrate high-voltage device structures with low voltage device structures on a single chip.

Some examples of devices that involve switching at relatively high-voltage levels include drivers for flat panel displays, lighting and ballast applications (e.g., light emitting diode (LED) lighting), power supplies (e.g., mobile device chargers), and numerous other products. The high-voltage MOS devices that are desirable for employment in these applications should desirably possess a high breakdown voltage, such as to prevent punch through from a high-voltage area to a low-voltage area, but also have a relatively low on-resistance.

Power devices may typically be categorized as being either vertical or lateral devices. Devices employing a vertical structure have a current path that flows from the top of the device to the bottom of the device via a substrate. Devices employing a lateral structure have a current path that enters and leaves the chip (integrated circuit) through the same surface (e.g., the upper surface of the chip). The lateral structure may allow implementation of different types and multiple numbers of lateral devices on the same substrate. However, doing so may only be effective with electrical isolation.

BRIEF SUMMARY OF EXEMPLARY EMBODIMENTS

Some example embodiments are therefore provided that may enable UHV operation with a chip area-efficient optimization. Moreover, some embodiments may provide an isolated structure for high side operation.

In one exemplary embodiment, a high-voltage metal-oxide-semiconductor (HVMOS) device is provided ("exemplary" as used herein referring to "serving as an example, instance or illustration"). The HVMOS may include a source, a drain, a gate positioned proximate to the source, a drift region disposed substantially between the drain and a region of the gate and the source, and a self shielding region disposed proximate to the drain.

In another exemplary embodiment, a method of providing a high-voltage metal-oxide-semiconductor (HVMOS) device is provided. The method may include providing a source and a gate proximate to each other, providing a drain, providing a drift region disposed substantially between the drain and a region of the gate and the source, and providing a self shielding region disposed proximate to the drain.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 illustrates a cross-sectional view of a UHV NMOS device according to an example embodiment;

FIG. 2, which includes FIGS. 2A to 2D, illustrates the process flow for producing the device of FIG. 1 according to an example embodiment;

FIG. 3 provides an illustration of doping concentrations for materials used in an example embodiment while highlighting four specific areas within the example device of FIG. 1;

FIG. 4, which includes FIGS. 4A to 4D, shows more detailed profiles of doping concentrations at each respective profile area highlighted in FIG. 3;

Figure 14:
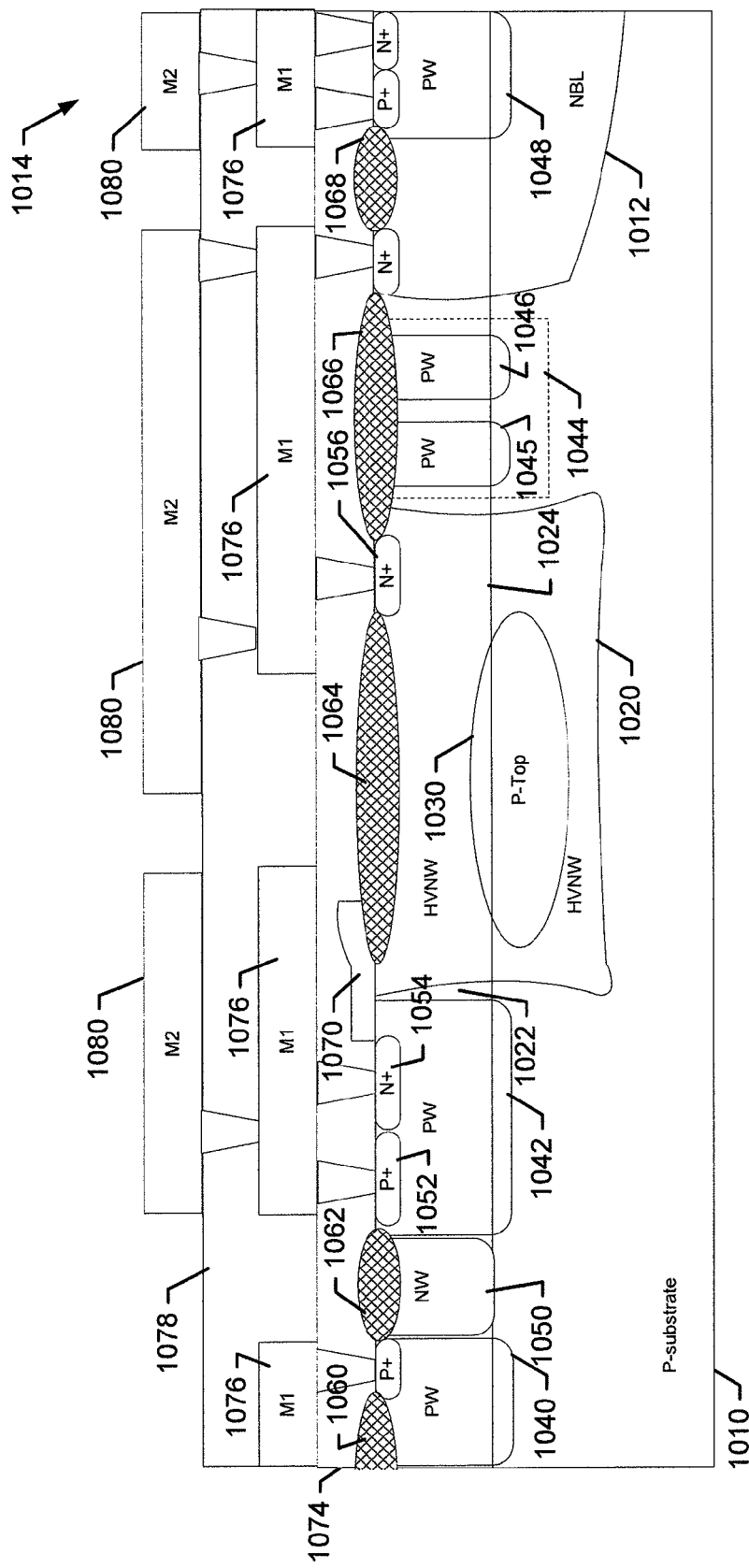
FIG. 14 illustrates a cross-sectional view of a UHV NMOS device according to an example embodiment.
Figure 16:
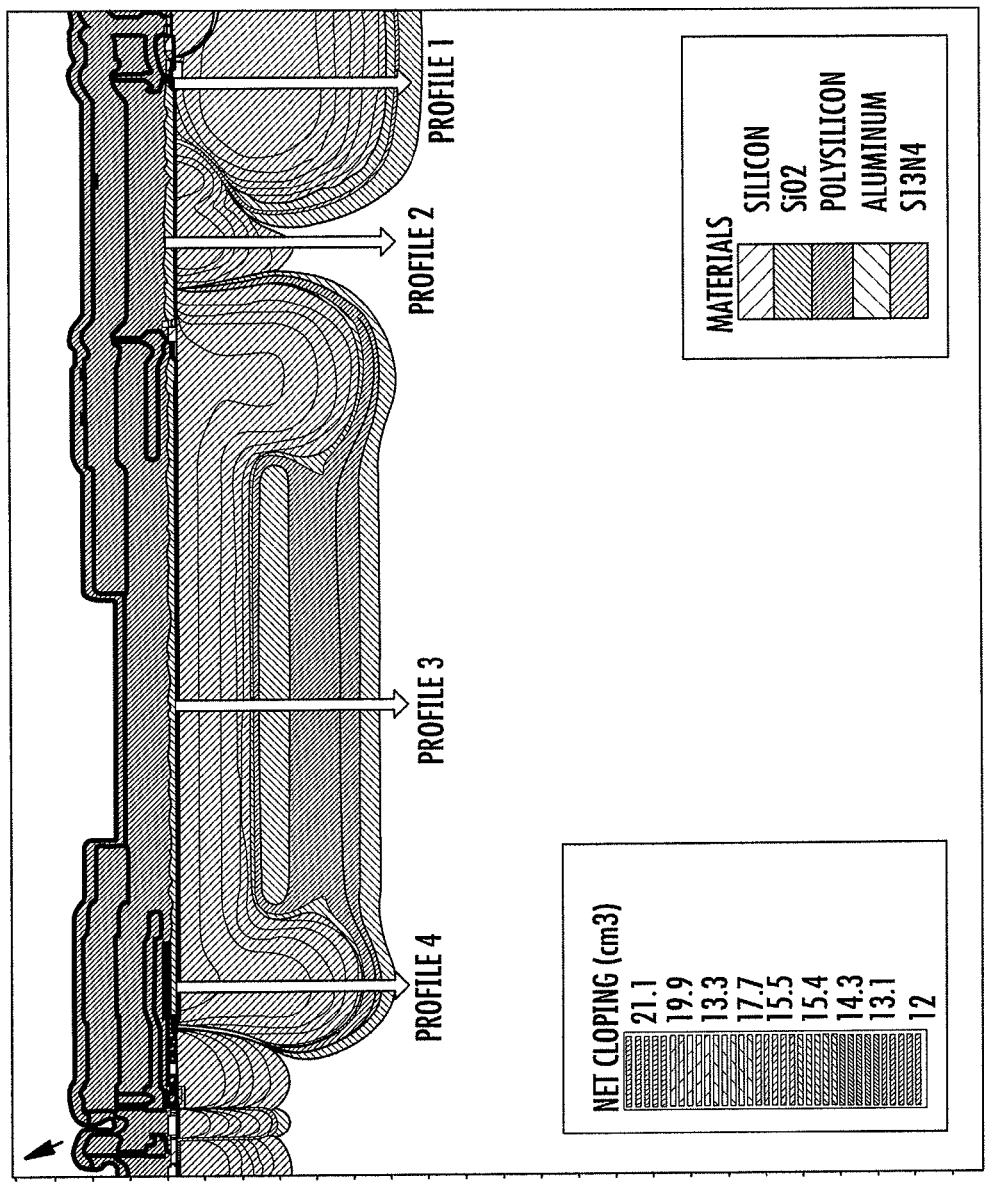
Figure 17A:
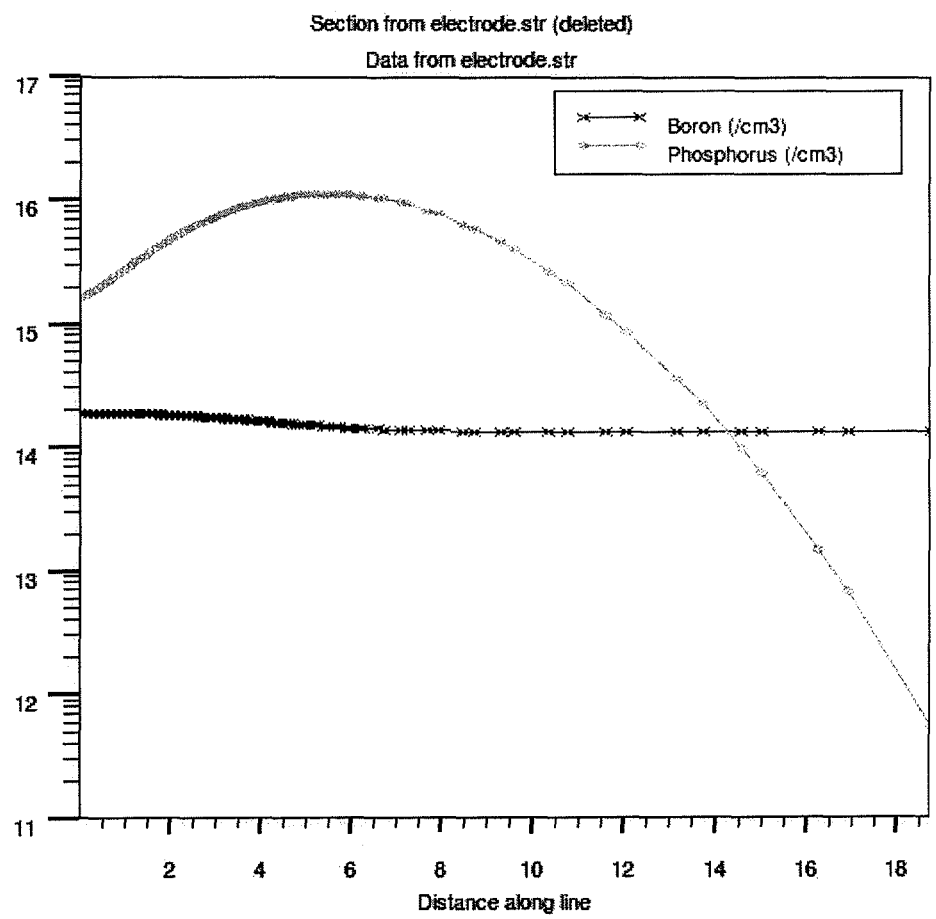
Figure 17B:
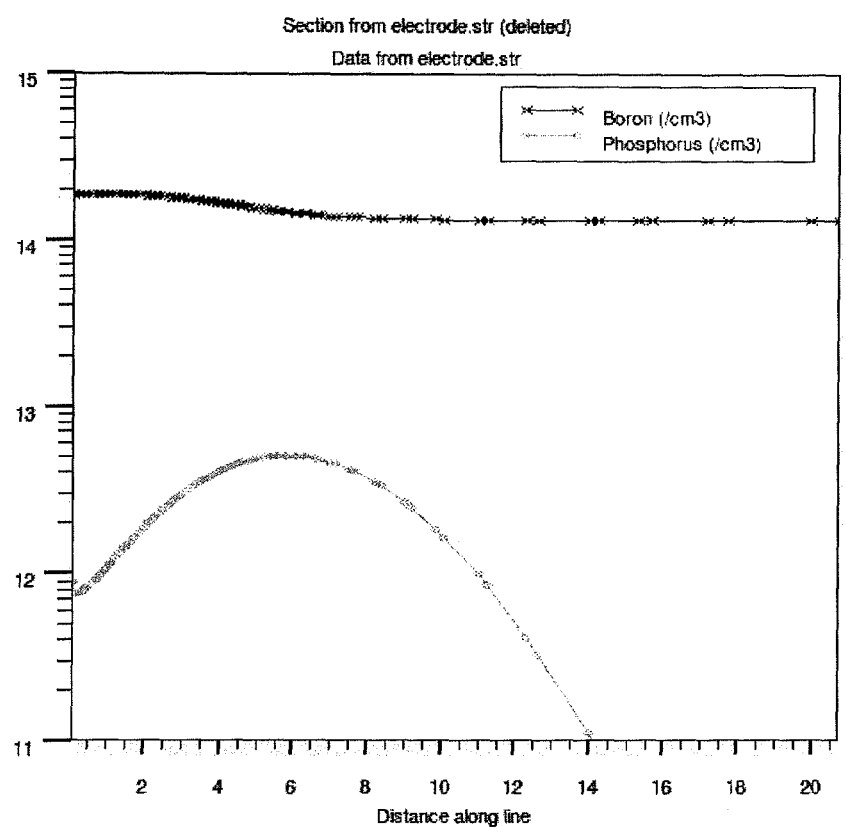
Figure 17C:
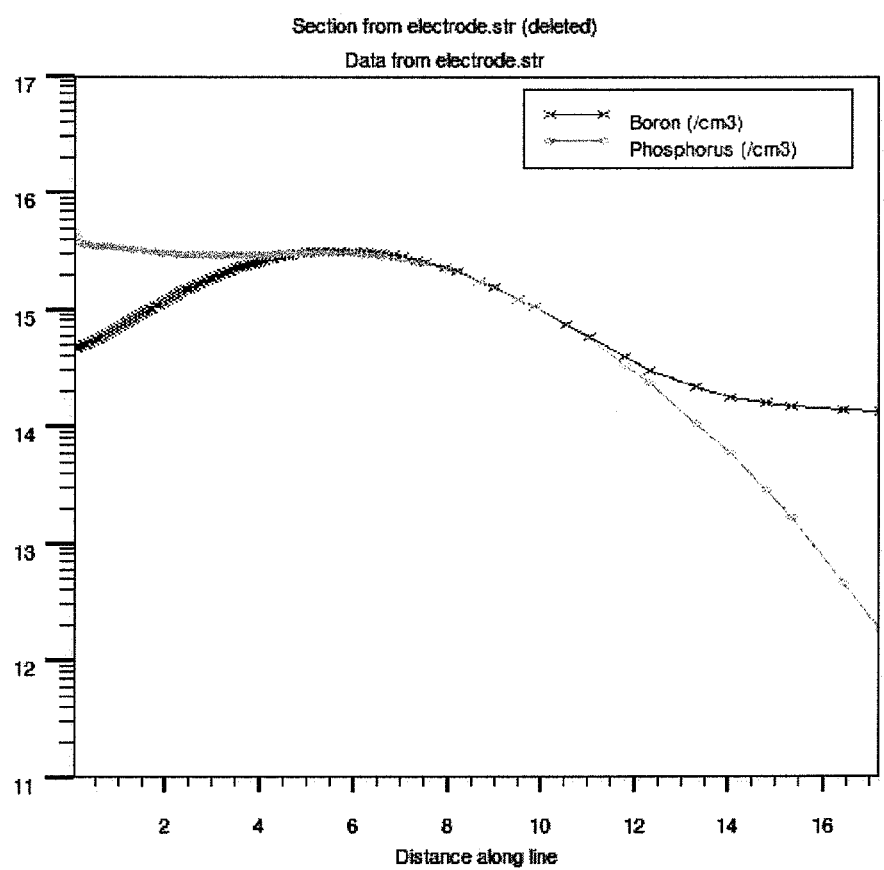
Figure 17D:
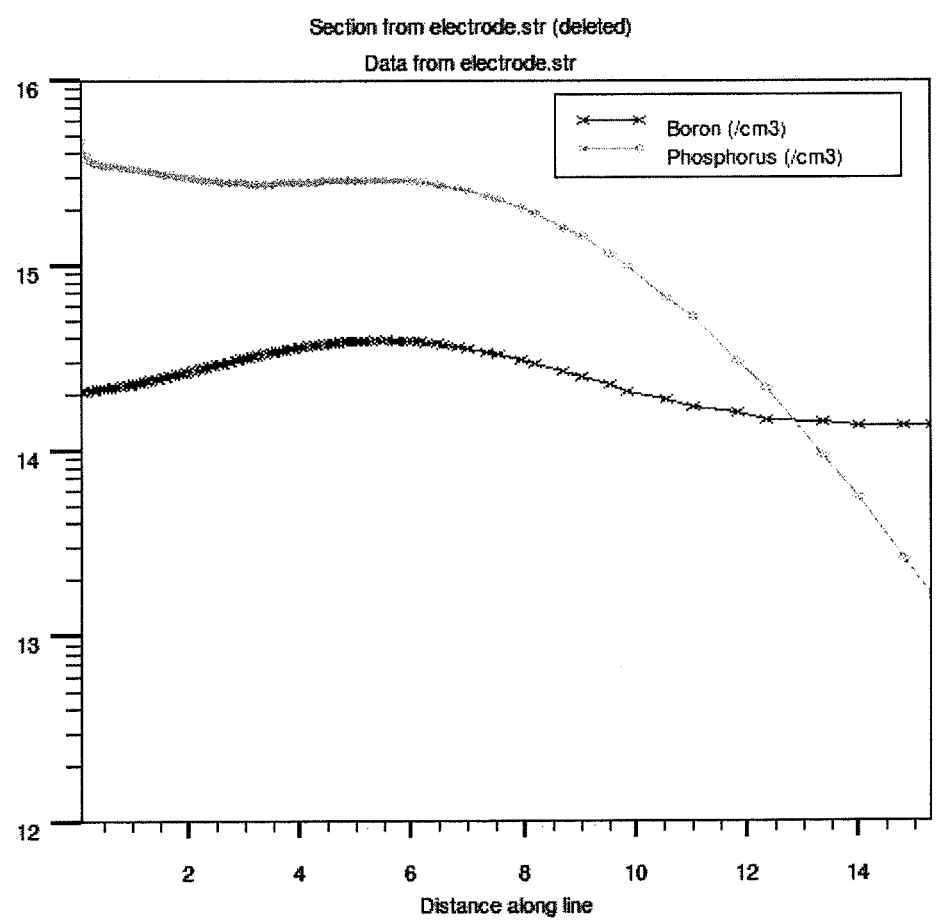
Figure 18:
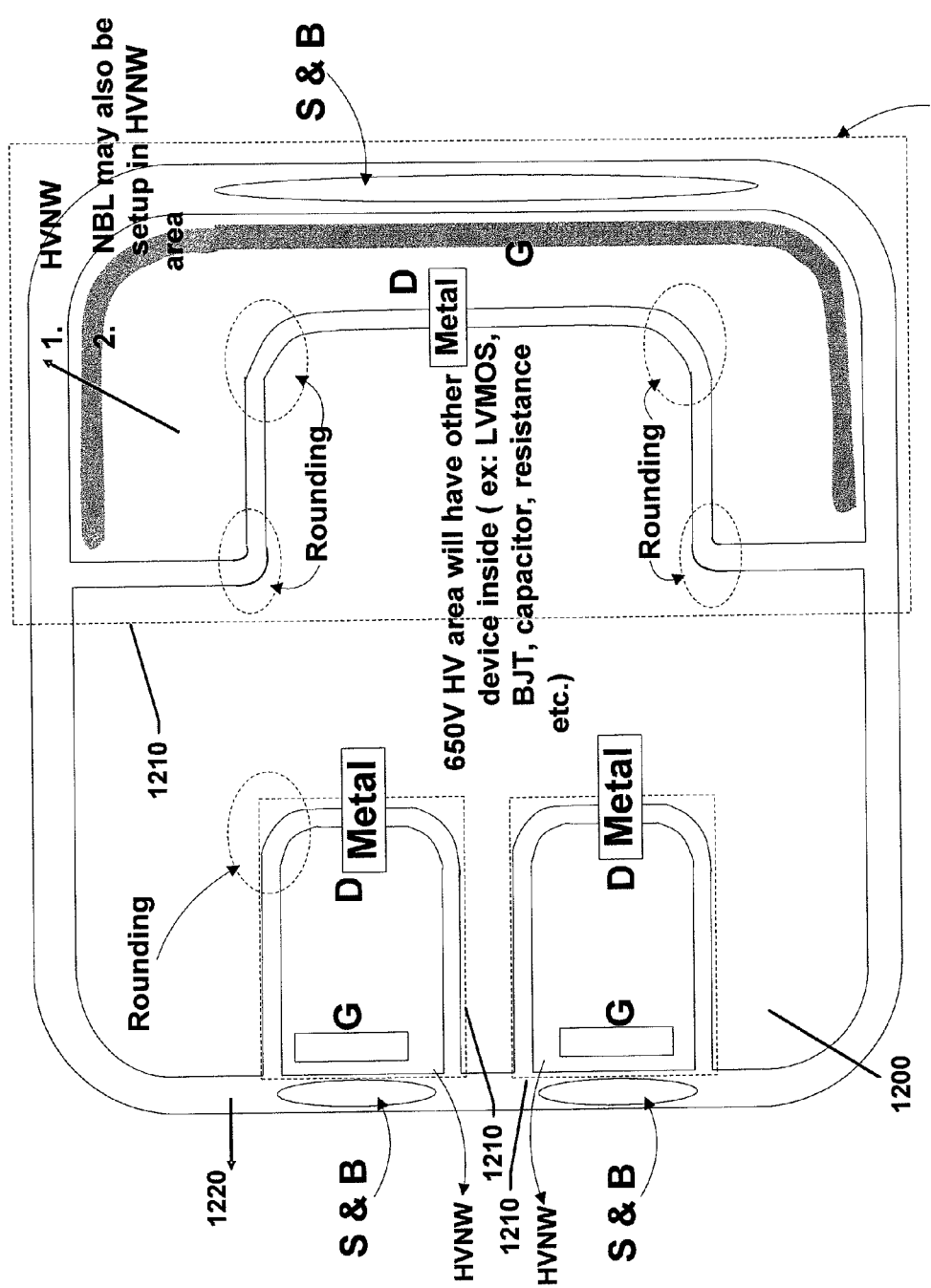

FIG. 15, which includes FIGS. 15A to 15D, illustrates the process flow for producing the device of FIG. 14 according to an example embodiment;

FIG. 16 provides an illustration of doping concentrations for materials used in an example embodiment while highlighting four specific areas within the example device of FIG. 14;

FIG. 17, which includes FIGS. 17A to 17D, shows more detailed profiles of doping concentrations at each respective profile area highlighted in FIG. 16;

FIG. 18 illustrates a top view of a device layout of an example embodiment

Figure 19:
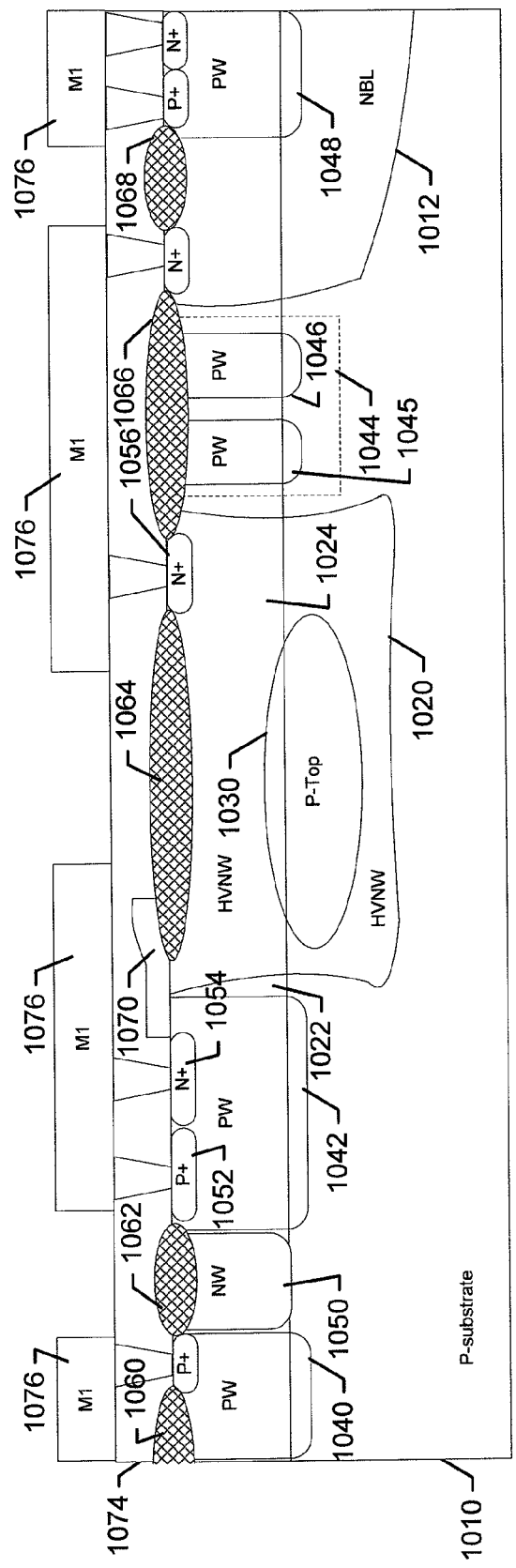
Figure 20:
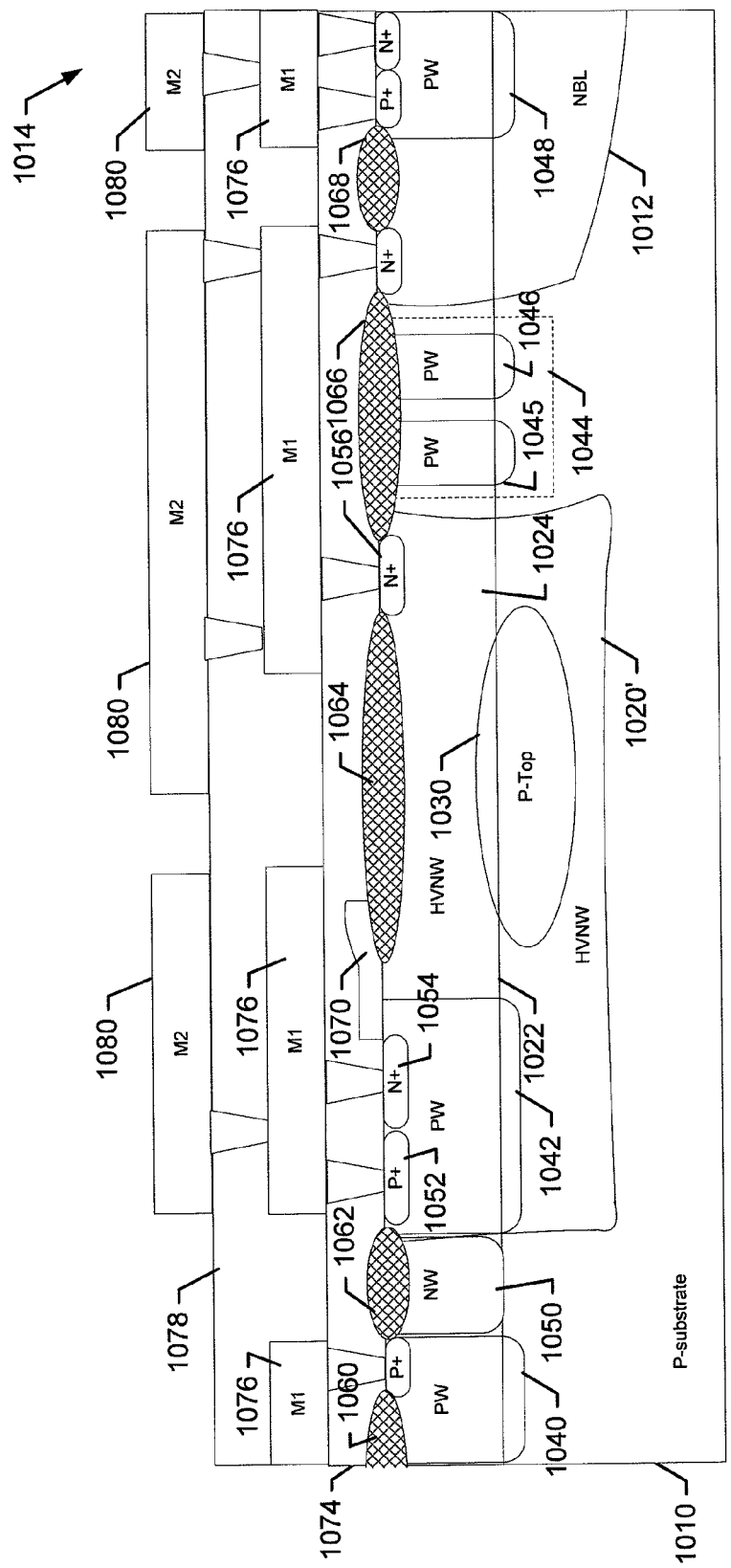
Figure 21:
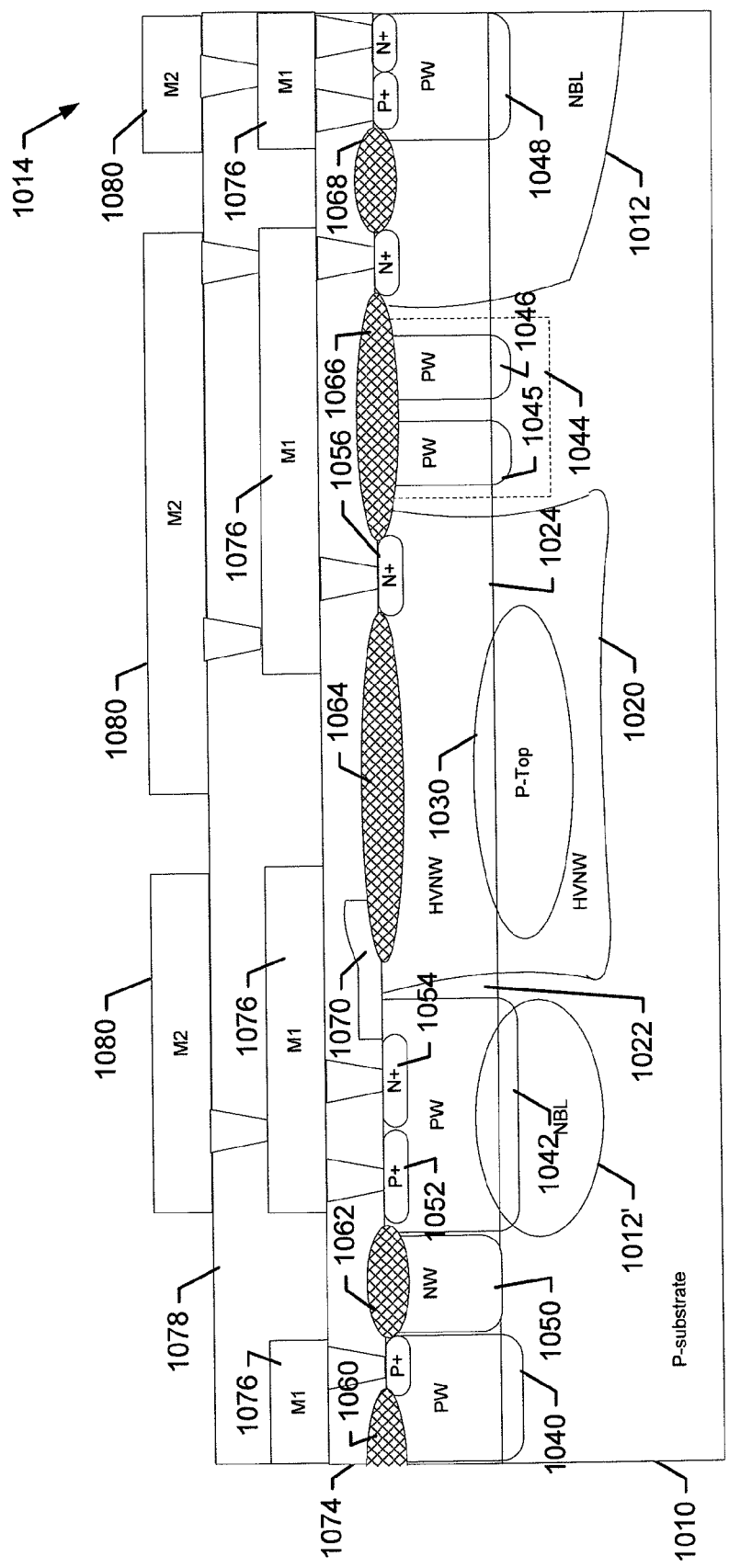
Figure 22:
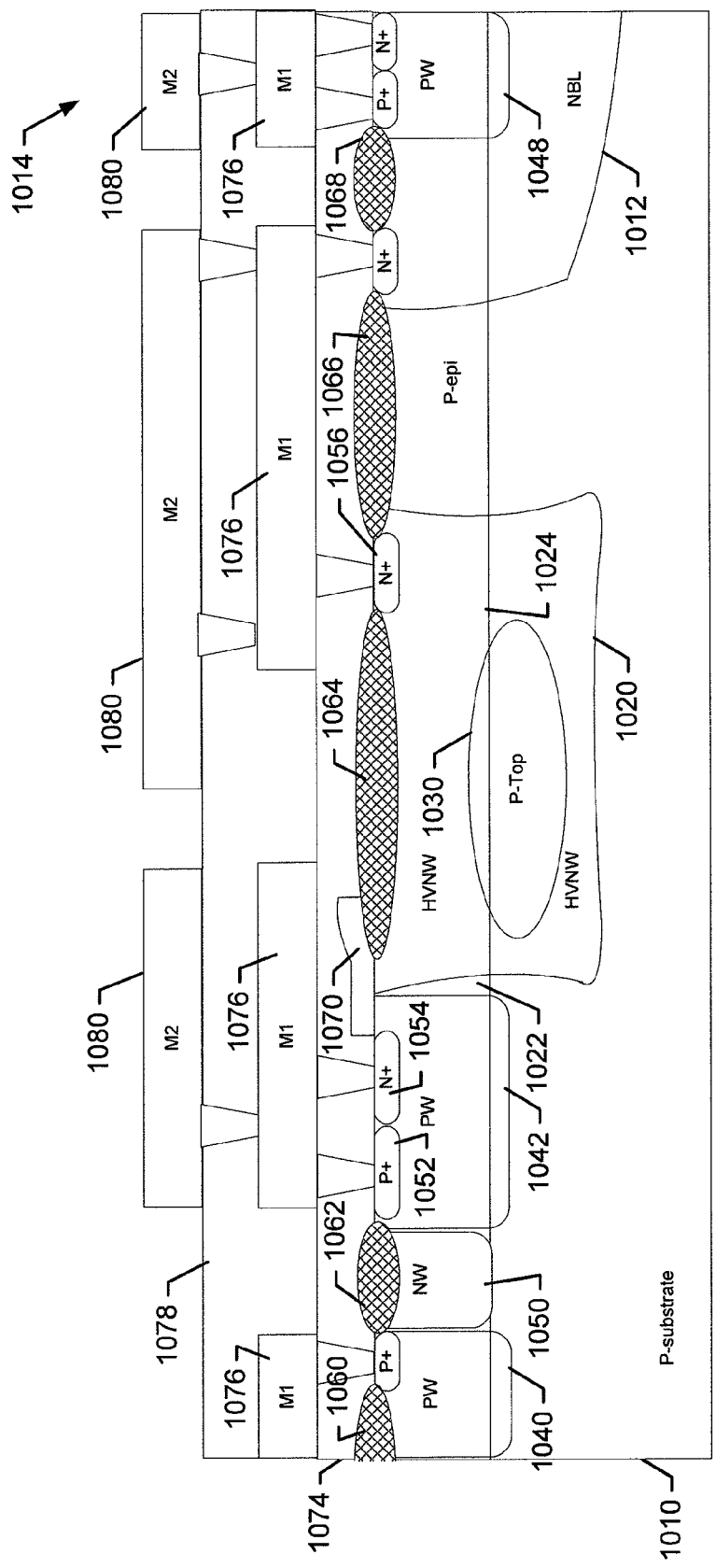
Figure 23:
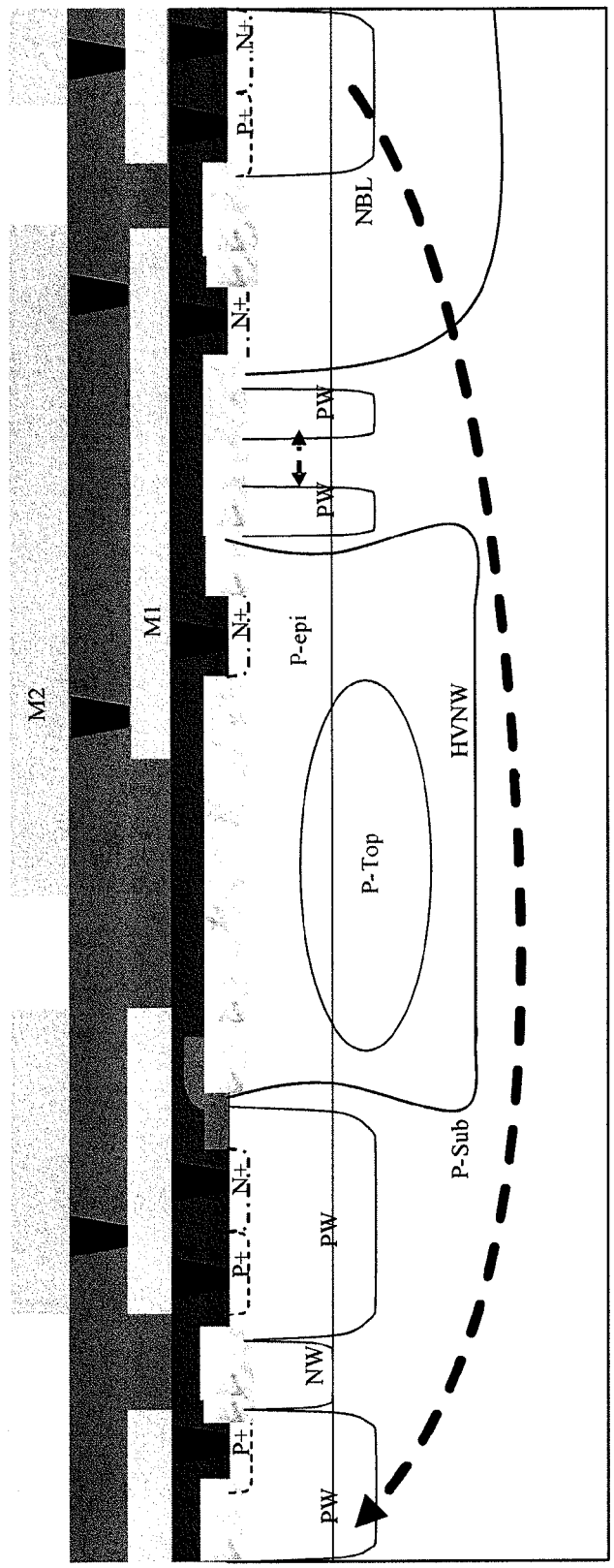
Figure 24:
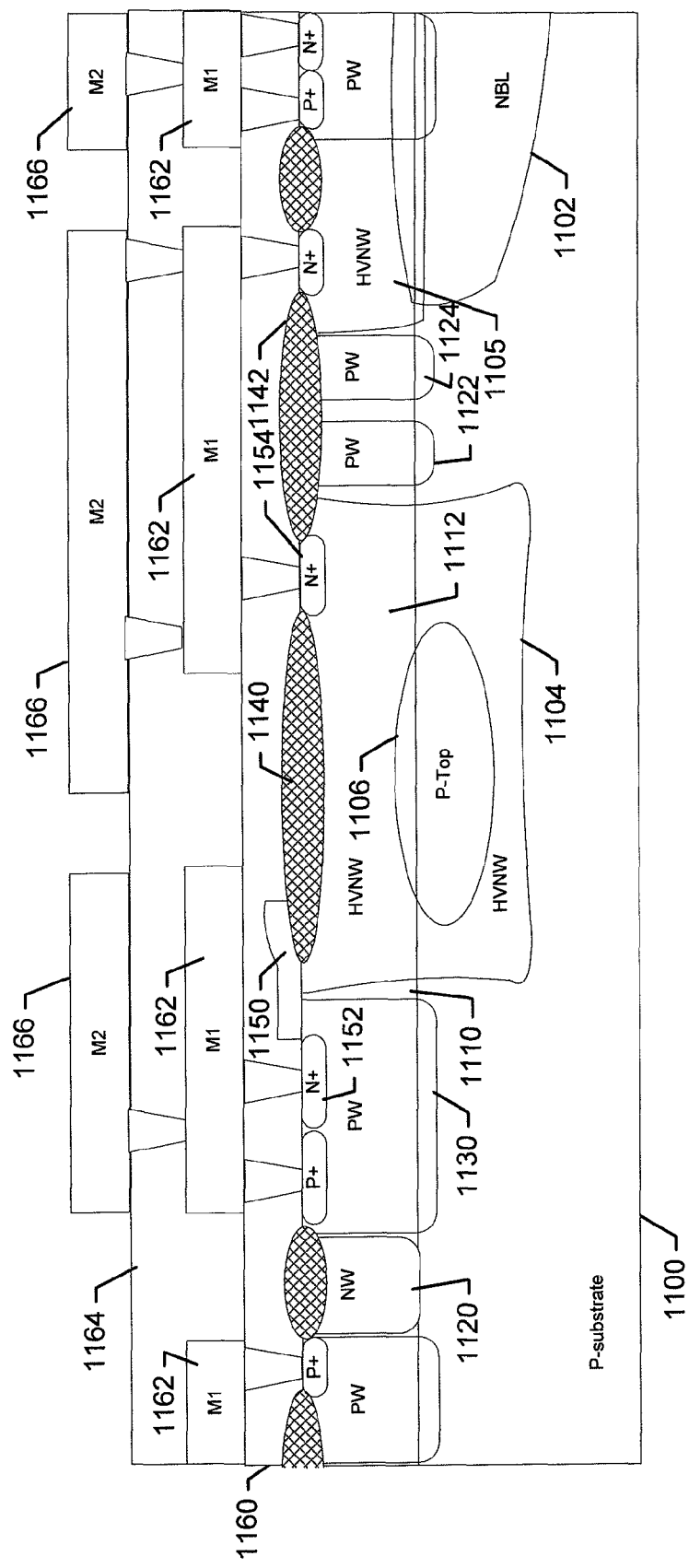
Figure 25:
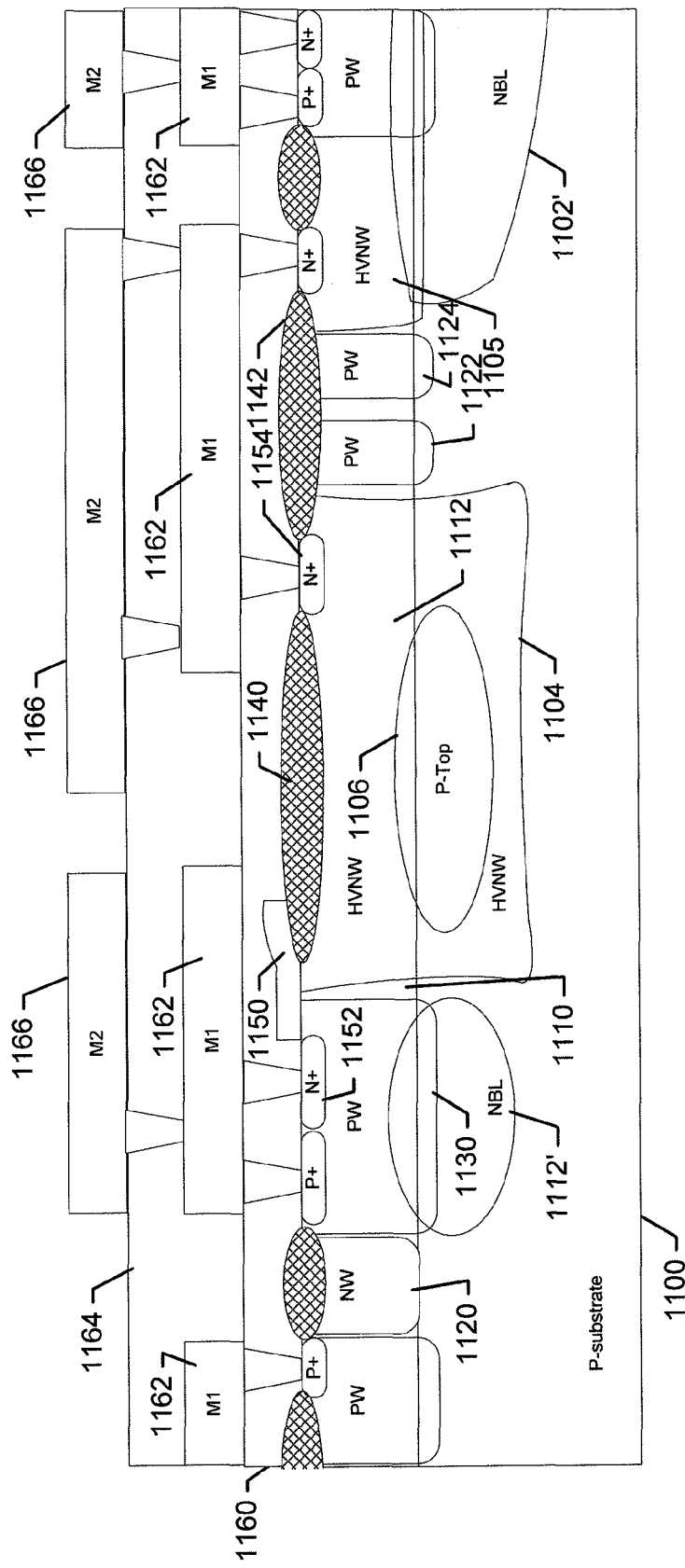

FIG. 19 illustrates an example embodiment employing a single metal field plate instead of having two metal field plates for electrical connections (as is shown in FIGS. 14 and 15;

FIG. 20 illustrates an alternative structure in which the HVNW can be extended under the bulk and source PW according to an example embodiment;

FIG. 21 illustrates an alternative structure in which an additional NBL is provided under the bulk and source PW according to an example embodiment;

FIG. 22 illustrates an alternative structure in which a P-well (PW) disposed in a high-voltage (HV) interconnection region is eliminated according to an example embodiment;

FIG. 23 shows how characteristics of features of example embodiments of the present invention provide isolation and self-shielding to avoid punch through between a high side and ground for a UHV NMOS constructed according to an example embodiment;

FIG. 24 illustrates an alternative structure in which an HVNW is set up in the high side area according to an example embodiment;

FIG. 25 illustrates another alternative structure in which an HVNW is set up in the high side area over an NBL and another NBL is also provided according to an example embodiment.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

Some embodiments of the present invention may provide an NMOS structure for UHV operation (e.g., greater than 650V). Moreover, some embodiments may provide a process flow for producing an isolated structure for high-side operation. Some embodiments may also provide a layout for UHV high current request for chip area-efficient optimization. The structure provided by example embodiments may include the use of an epitaxially-grown N-layer (N-epi). Some embodiments may also employ P-type material in a particular P-well (PW) configuration to provide isolation for both self shielding and isolation purposes. N-type material may also be employed in a high-voltage N-well (HVNW) to support sustained operation at UHV. In some embodiments, the HVNW may be applied in the substrate, below the N-epi layer. As such, the HVNW layer may be set up before the N-epi layer is deposited.

Figure 1:
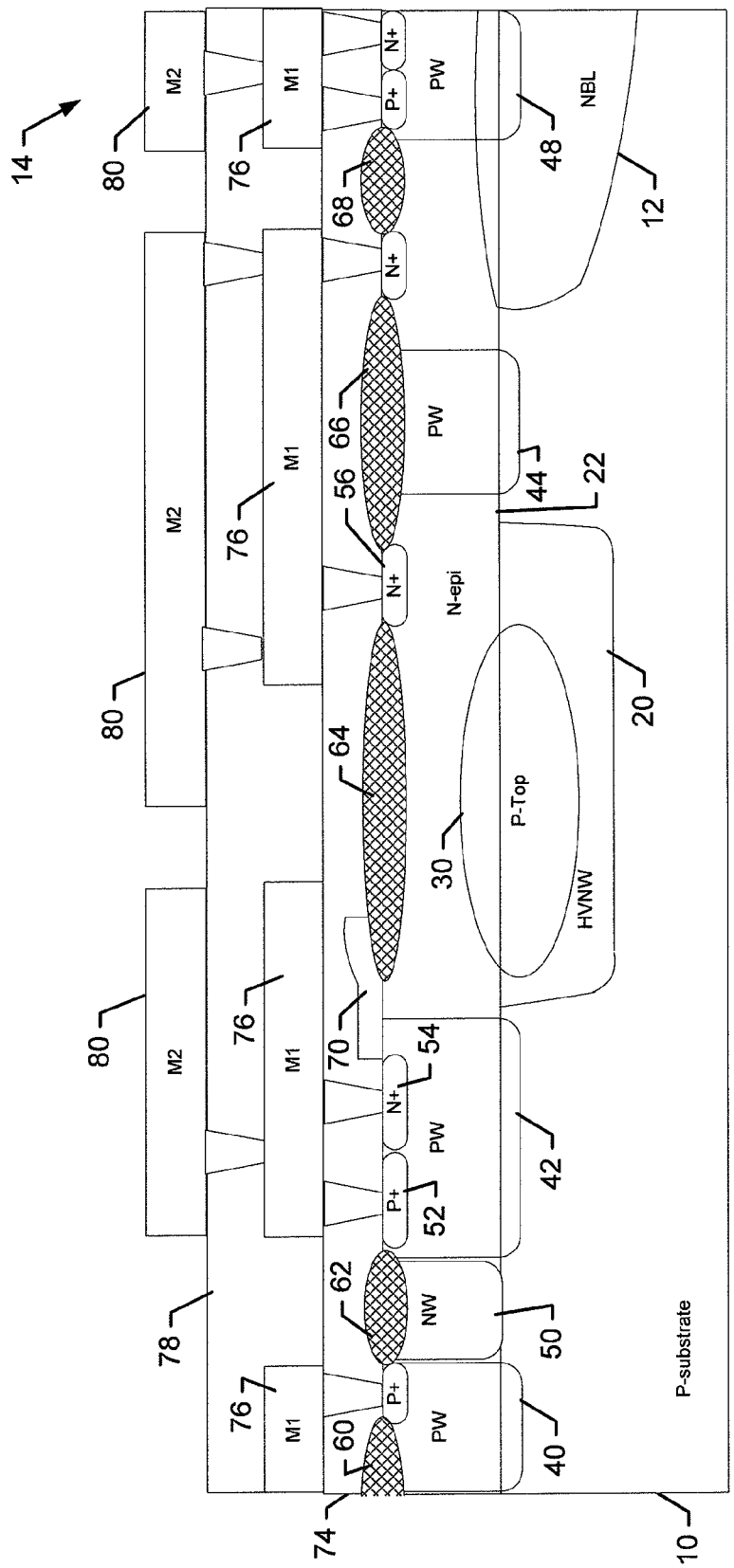

FIG. 1 illustrates a cross sectional view of a UHV NMOS device according to an example embodiment. The device may include a substrate 10. In an example embodiment the substrate 10 may be a P-substrate. In an example embodiment, the device may further include an N-doped buried layer (NBL) 12 disposed at a high-side operating region 14 of the substrate 10. Among perhaps other things, the NBL 12 may provide isolation functionality for the high side operating region 14. The substrate 10 may also include a HVNW layer 20 disposed within the substrate 10. In an example embodiment, a N-epi layer 22 may be disposed over the substrate 10. The HVNW layer 20 may provide an increased critical electrical field for prevention of breakdown at high operating voltages (e.g., greater than 650V).

In some embodiments, the HVNW layer 20 may include a P-type top layer (P-Top) 30 disposed thereat. The P-Top 30 layer may reduce surface field prior to breakdown. The N-epi 22 may have one or more P-wells (PWs) and/or N-wells (NWs) provided therein (such wells at various instances being referred to herein as well regions—e.g., PW regions). As shown in FIG. 1, for example, a PW 40, a bulk and source PW 42, a high-voltage interconnection region PW 44 and a high-side operating region PW 48 may be provided along with an NW 50. In some embodiments, the PW regions may further include regions having higher doping concentrations of P-type or N-type material as indicated by the P+ and N+ regions, respectively. The P+ region of the bulk and source PW 42 may correspond to a bulk 52 of the device, while the N+ region of the bulk and source PW 42 may correspond to the source 54 of the device. Meanwhile, an N+ region disposed within the N-epi 22 at a portion of the N-epi 22 that corresponds to an edge of the HVNW layer 20 may form the drain 56 of the device.

In an example embodiment, a plurality of field-oxide films (FOXs) may be disposed proximate to the N-epi 22 (and/or any or all of the PWs, NWs). In an example embodiment, a first FOX 60 may be disposed proximate to a portion of the PW 40, a second FOX 62 may be disposed proximate to the NW 50, and a third FOX 64 may be disposed between the bulk and source PW 42 and the N+ region corresponding to the drain 56. A fourth FOX 66 may be disposed proximate to the high-voltage interconnection region PW 44, and a fifth FOX 68 may be disposed between an N+ region disposed over the NBL 12 and the high side operating region PW 48.

In an example embodiment, a gate 70 of the device may be formed between the source 54 and the third FOX 64. The gate 70 may extend over a portion of the bulk and source PW 42 and the third FOX 64. A region of the device extending between the edge of the bulk and the edge of the drain may define a UHV NMOS. The high-voltage interconnection region PW 44 may provide isolation between the UHV NMOS and other components on the same substrate of a lateral HVIC or PIC defined by the device of FIG. 1.

In an example embodiment, an insulating layer 74 may be deposited over the FOXs, and the PWs and NWs or portions of the N-epi 22 that may be exposed. The insulating layer 74 may have various electrodes (e.g., corresponding the bulk, source and drain) positioned therein. In some embodiments, a metallic layer 76 may be deposited over selected portions of the insulating layer 74. The metallic layer 76 may be used to connect the UHV NMOS to various other components. Moreover, in some cases, a portion of the metallic layer 76 may pass over the high-voltage interconnection region PW 44 to provide interconnection between UHV NMOS and other components. The PW 44 can provide self-shielding and isolation. The portion of the metallic layer 76 passing over the high-voltage interconnection region PW 44 may be referred to as a high-voltage interconnection. In some example embodiments, another insulating layer 78 may be deposited over the metallic layer 76 and a second metallic layer 80 may be provided over the insulating layer 78.

Figure 2A:
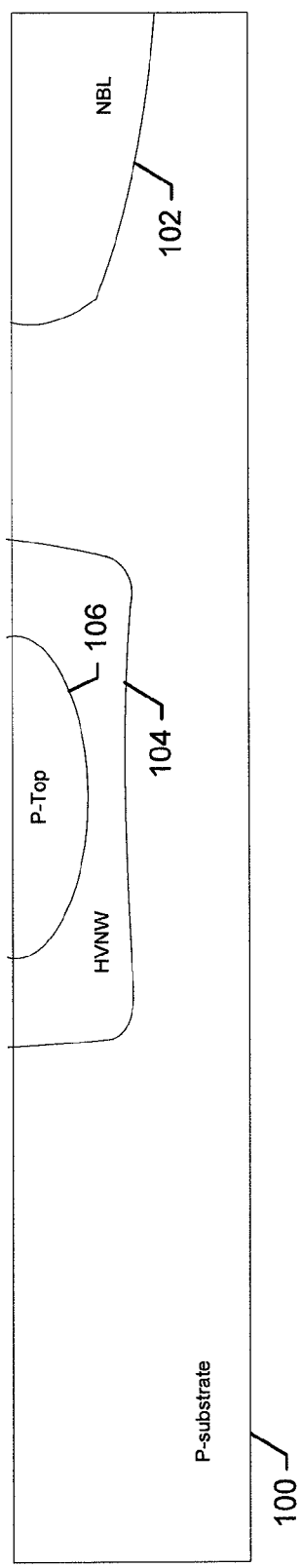

FIG. 2, which includes FIGS. 2A to 2D, illustrates the process flow for producing the device of FIG. 1 according to an example embodiment. As shown in FIG. 2A, a P-substrate 100 may initially be provided, and an NBL 102 may be formed in the P-substrate 100, such as via photolithography and implantation processes. An HVNW region 104 may then be formed in a portion of the P-substrate 100 that is spaced apart from the NBL 102. The HVNW region 104 may also be formed via photolithography and implantation processes. In some embodiments, a P-Top region 106 may then be formed within the HVNW region 104, such as via photolithography and implantation processes. In some instances, forming the NBL 102 may be completed with a drive in process.

Figure 2B:
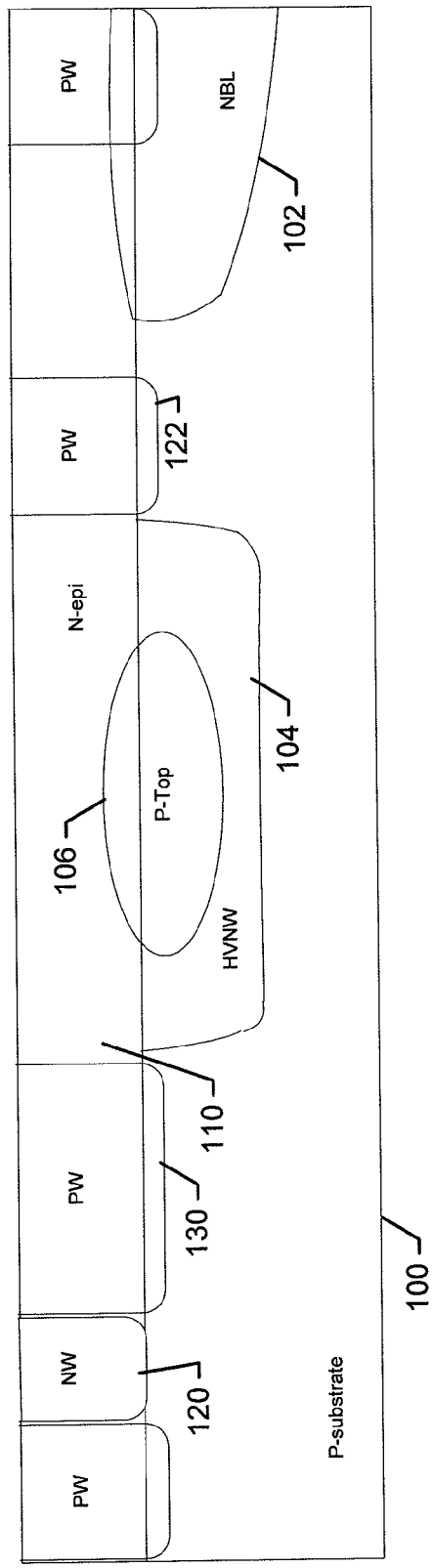

FIG. 2B illustrates a further progression of the process flow for producing the device of FIG. 1 according to an example embodiment. As shown in FIG. 2B, a N-epi layer 110 may be deposited over the P-substrate 100 (and the exposed portions of the HVNW region 104, the NBL 102 and the P-Top region 106). The N-epi layer 110 may be epitaxially grown over the P-substrate 100. Following photolithography and implantation processes used to provide various PWs through the N-epi layer 110, a drive in operation may be completed with respect to the HVNW region 104. An NW 120 may also be provided in the N-epi layer 110 via photolithography and implantation processes followed by a drive in operation.

The PWs that are provided in the N-epi layer 110 may include a PW 122 that is disposed between the HVNW region 104 and the NBL 102. The PW 122 may provide shielding and isolation in a high-voltage interconnection region of the device. Other PWs that may be provided in the N-epi layer 110 may include a bulk and source PW 130.

Figure 2C:
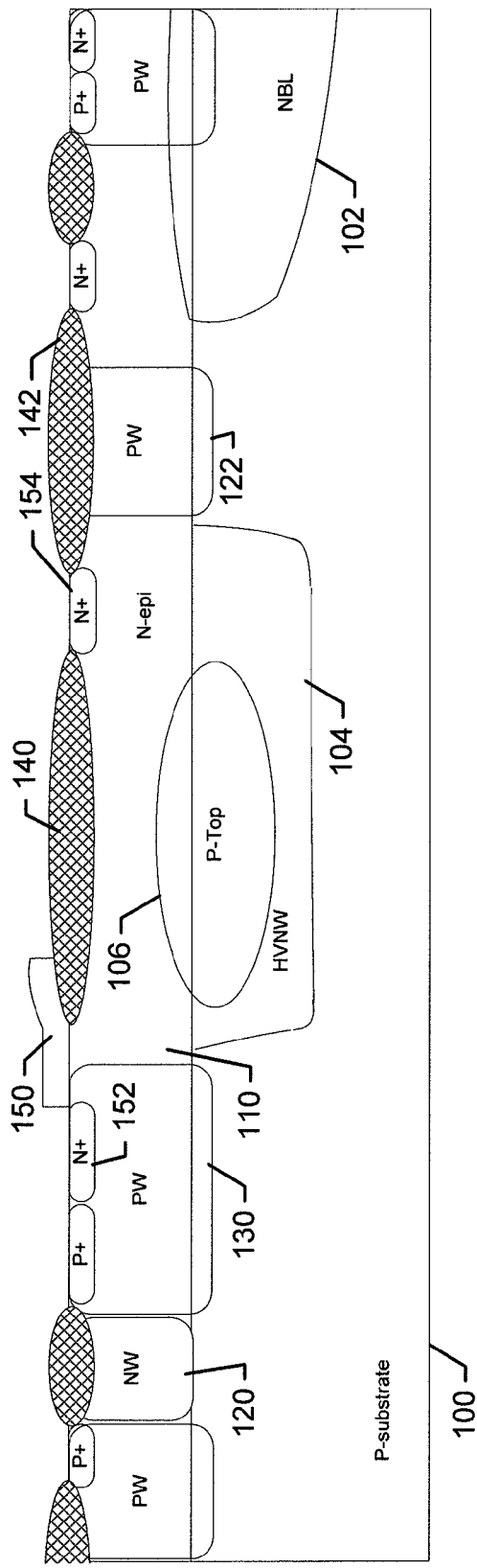

As shown in FIG. 2C, a plurality of FOX films may be grown at locations corresponding to various ones of the regions described above. The FOX films may be grown at their respective locations while employing photolithography techniques. In an example embodiment, among the FOX films grown, a first FOX 140 may be grown over a portion of the HVNW region 104, and a second FOX 142 may be grown over the PW 122. A polysilicon layer may be deposited over the top of the exposed portions and then all but a portion of the polysilicon layer that extends from the bulk and source PW 130 to the first FOX 140 may be removed via photolithography techniques in order to form a gate 150. Thereafter, further photolithography techniques and implantation may be undertaken to introduce N-type and P-type dopants of different concentrations into various portions of the N-epi layer 110 and the PWs. For example, the bulk and source PW 130 may have P and N-doped regions formed therein to define a bulk and source 152, respectively. Meanwhile, the exposed portion of the N-epi layer 110 that is between the first FOX 140 and the second FOX 142 may be formed with an N-doped region to define the drain 154.

Figure 2D:
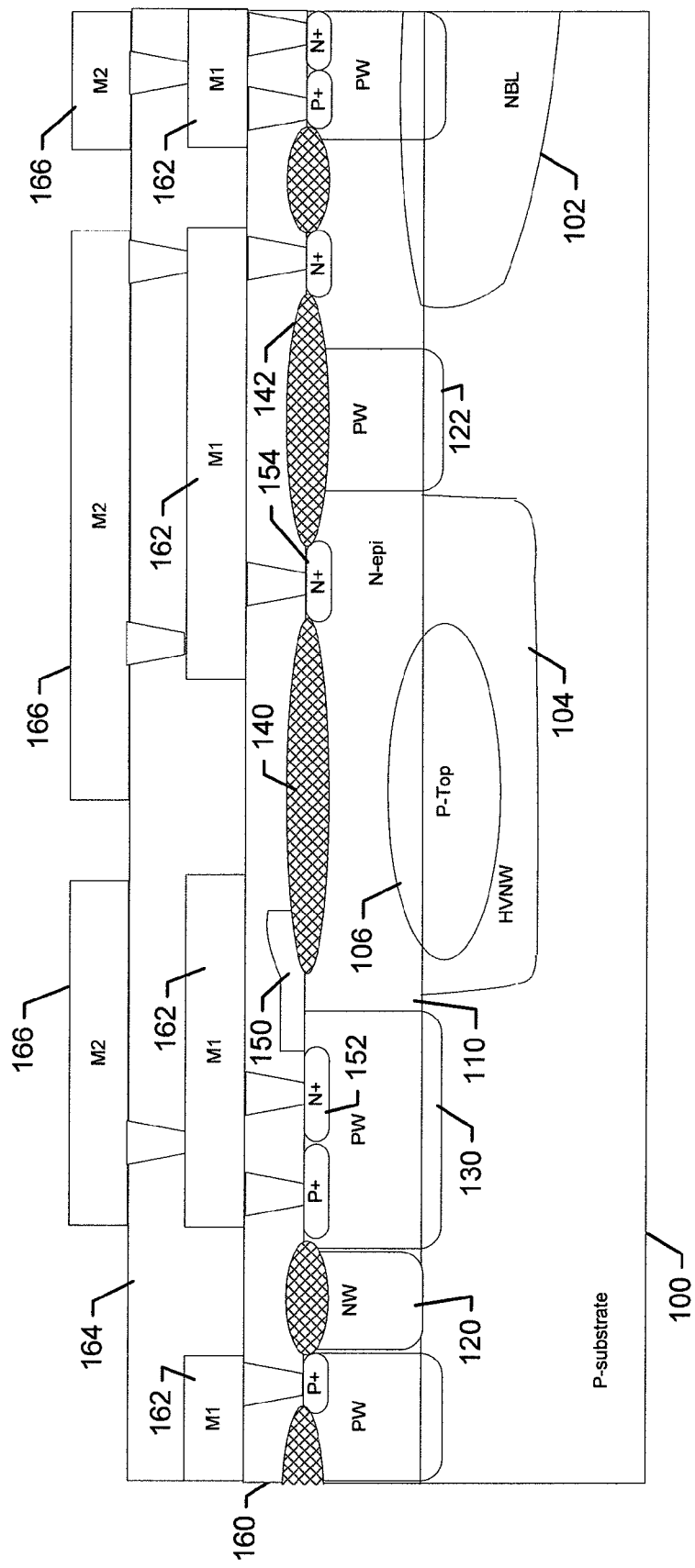

As shown in FIG. 2D, an inter-layer dielectric (ILD) material 160 may be deposited over the exposed FOX films, the gate 150, bulk and source 152, drain 154, the PW 122 and other exposed items. The contacts may be included in the ILD material 160 corresponding to the bulk and source 152, the drain 154 and various other components. The ILD material 160 may then be covered with a first metallic layer 162. Portions of the first metallic layer 162 may then be removed using photolithography techniques to form interconnect lines where desired. Thereafter, an inter-metal dielectric (IMD) layer 164 may be formed with contacts provided as appropriate. A second metallic layer 166 may then be formed over the IMD layer 164, and portions of the second metallic layer 166 may be removed using photolithography techniques to again form interconnect lines where desired.

Figure 3:
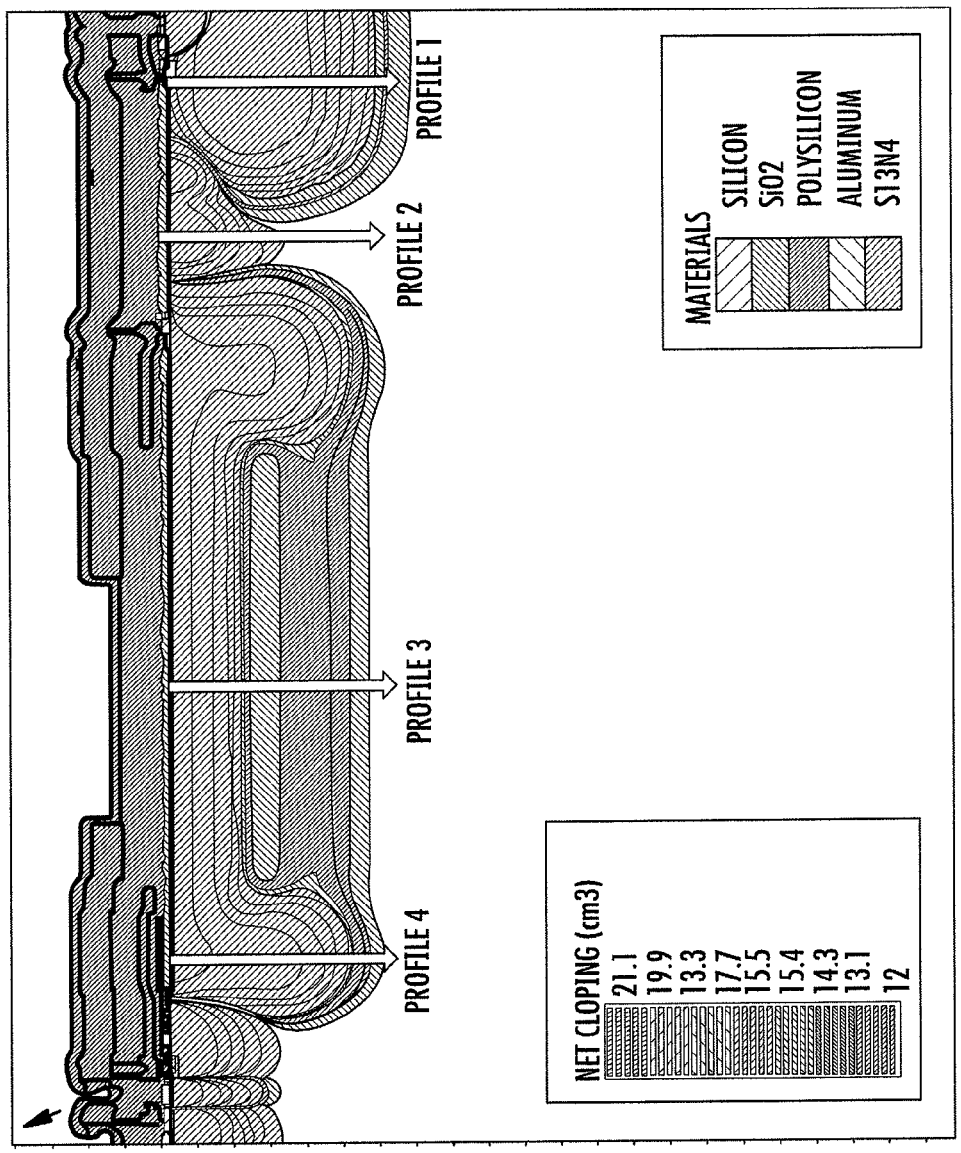
Figure 4A:
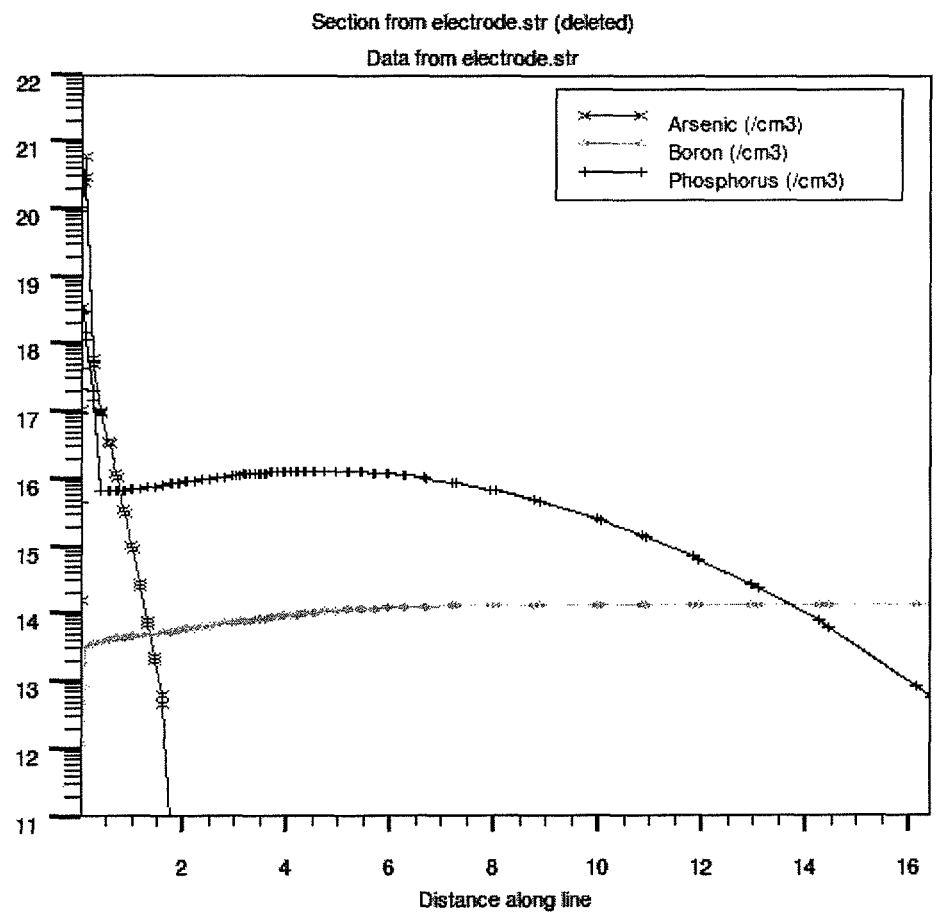
Figure 4B:
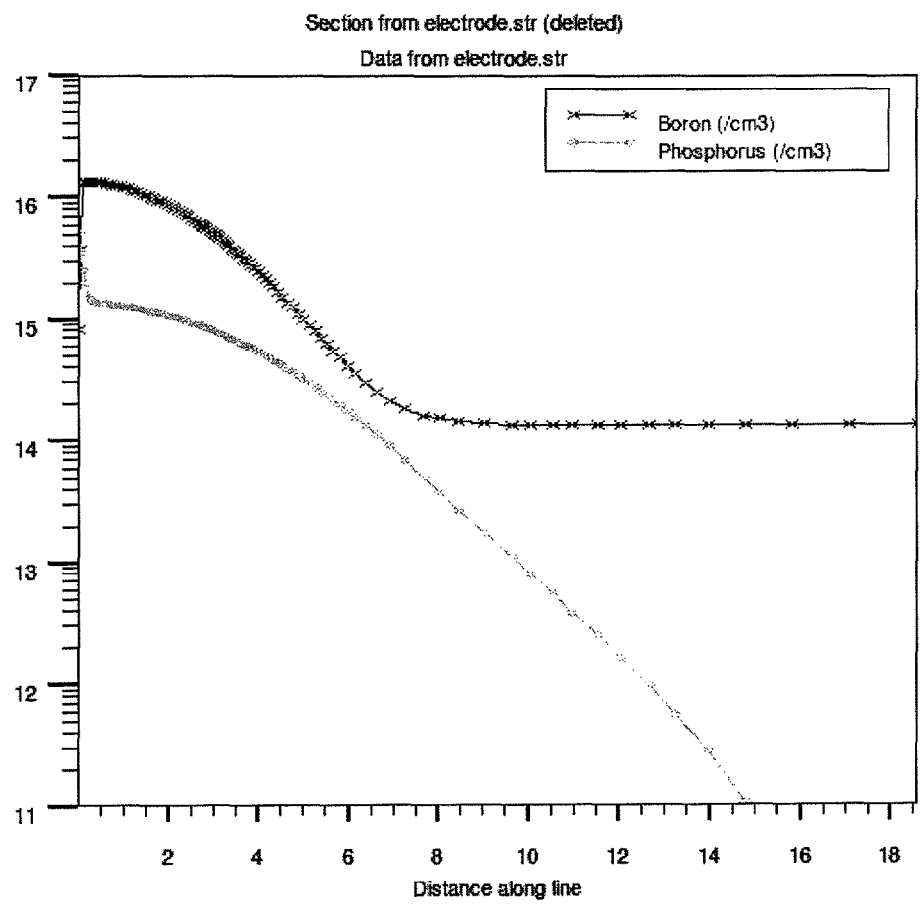
Figure 4C:
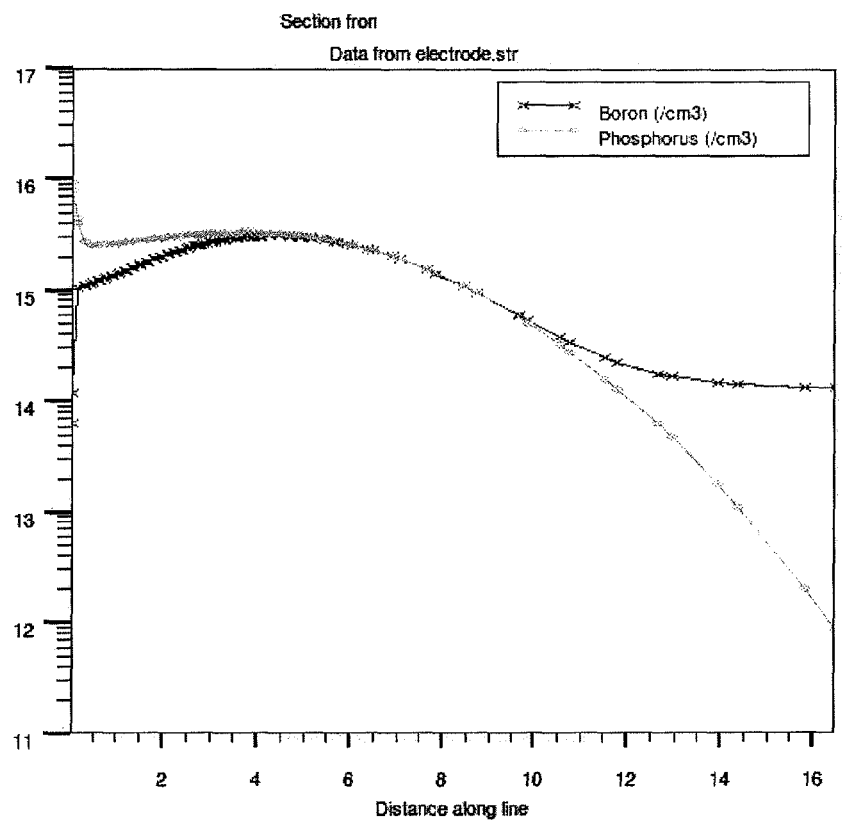
Figure 4D:
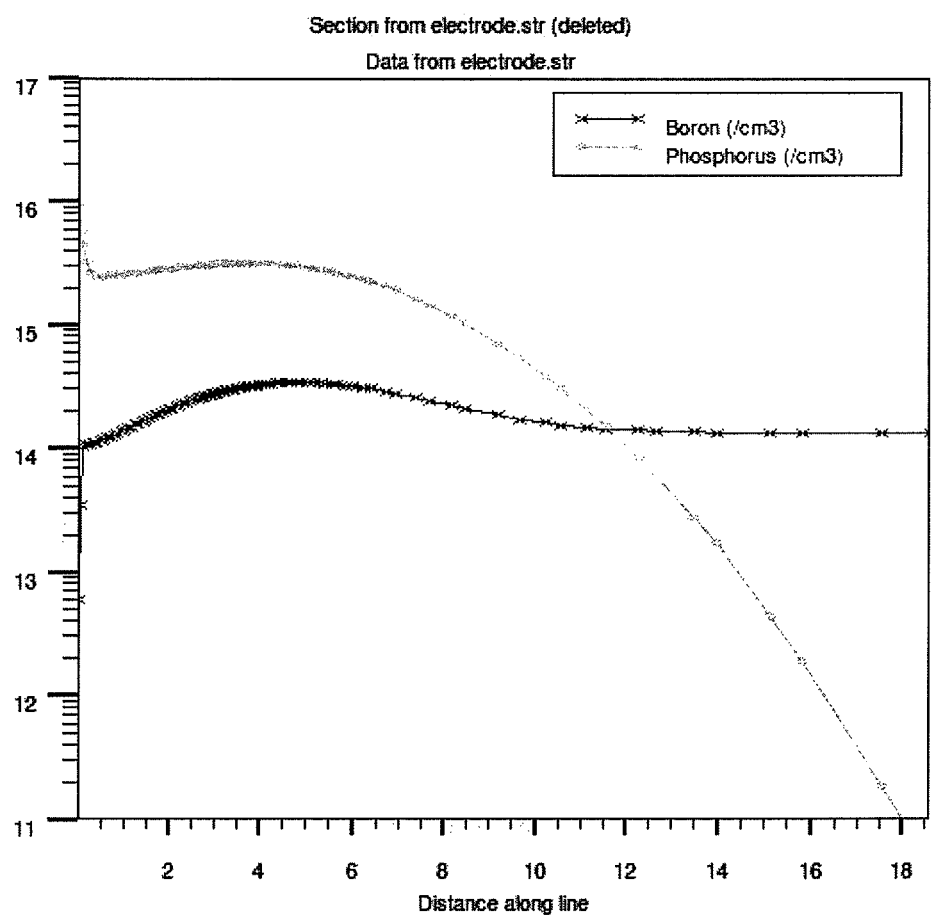

FIG. 3 provides an illustration of doping concentrations for the materials used in an example embodiment and highlighting four specific areas (labeled as profile 1, profile 2, profile 3 and profile 4, respectively) within the device of FIG. 1. FIG. 4, which includes FIGS. 4A to 4D, shows more detailed profiles of doping concentrations at each respective area. In this regard, FIG. 4A corresponds to profile 1 on FIG. 3, FIG. 4B corresponds to profile 2 on FIG. 3, FIG. 4C corresponds to profile 3 on FIG. 3, and FIG. 4D corresponds to profile 4 on FIG. 3.

Figure 5:
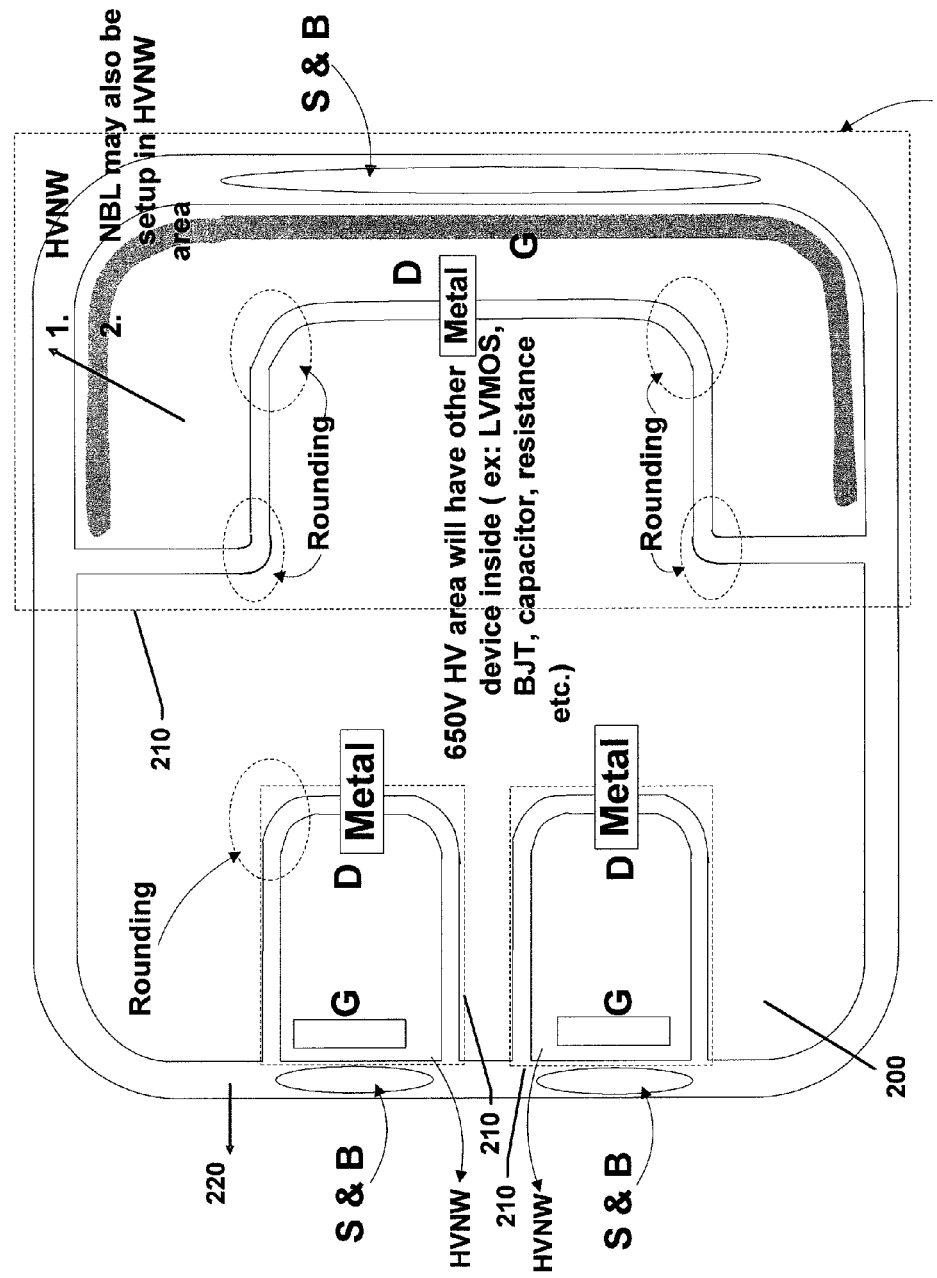
FIG. 5 illustrates a top view of a device layout of an example embodiment.

FIG. 5 illustrates a top view of a device layout of an example embodiment. As indicated above, a lateral structure may allow the use of different types and/or multiple numbers of lateral devices to be implemented on the same substrate so long as effective electrical isolation is provided. Example embodiments of the present invention may provide sufficient isolation to enable sustained operation at very high voltages (e.g., greater than 650V) on the high side. Accordingly, as shown in FIG. 5, a device with multiple MOS devices, including perhaps both high-voltage MOS (HVMOS) and low-voltage MOS (LVMOS) devices, may be provided on the same substrate.

As shown in FIG. 5, three MOS devices (which could be any combinations of HVMOS and LVMOS) may be provided on the same substrate. It should be noted that embodiments could also provide other devices (e.g., LVMOS, bipolar junction transistors (BJTs) capacitors, resistors, etc.) in the HV area. Each of the devices has a corresponding gate G, drain D, and a source and bulk S & B. HVNW areas (which may include two layers laid down as described above) are indicated below each respective gate G and drain D region. In some cases, the NBL may also be set up in the HVNW area. However, a separate NBL region 200 is also shown in FIG. 5. Metal may be formed over portions of the device, as described above, in order to provide for any connection lines that may be needed for a particular implementation. A PW isolation region 210 for self-shielding is also shown. Other PW portions 220 are also indicated and may be employed for grounding. In an exemplary embodiment, the larger region within the dashed line (depicted on the right side in FIG. 5) may be provided for high current request.

Example embodiments like those described above may enable the formation of multiple components on the same substrate with UHV operation. However, embodiments of the present invention are not limited to those specifically described above. Instead, those of skill in the art will appreciate that various modifications to the examples described above may be applied without departing from the spirit and scope of embodiments of the present invention. FIGS. 6-11 show some alternative structures that may be employed in connection with example embodiments of the present invention.

Figure 6:
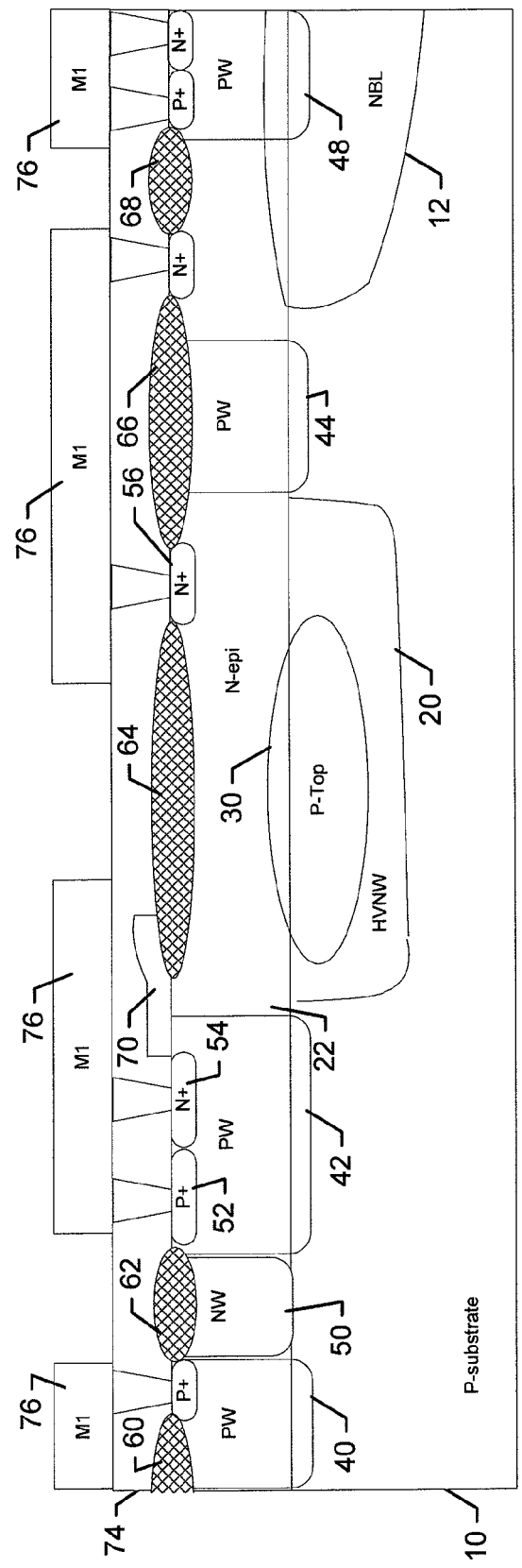
FIG. 6 illustrates an example embodiment employing a single metal field plate instead of having two metal field plates for electrical connections (as is shown in FIGS. 1 and 2.
Figure 7:
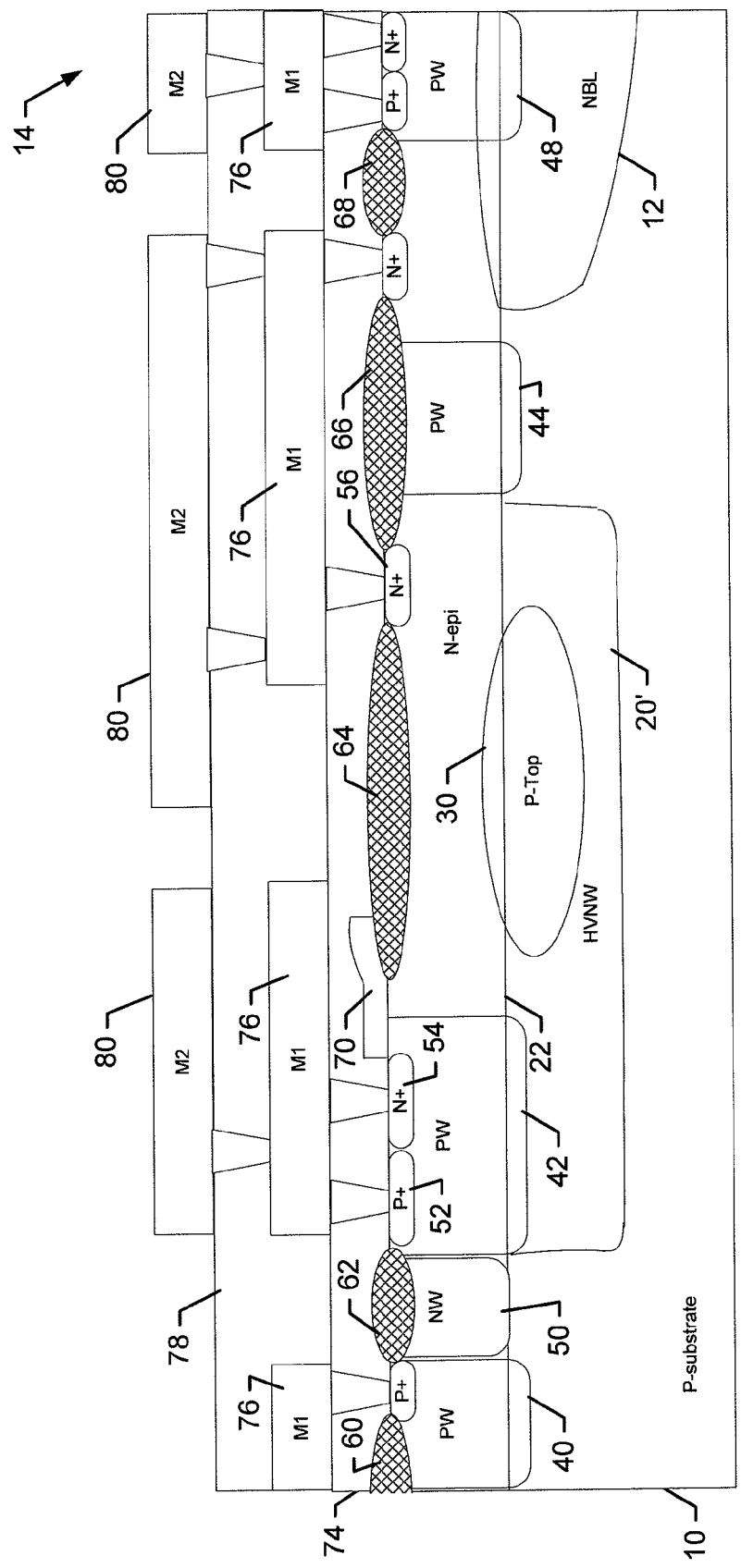
FIG. 7 illustrates an alternative structure in which the HVNW can be extended under the bulk and source PW according to an example embodiment.
Figure 8:
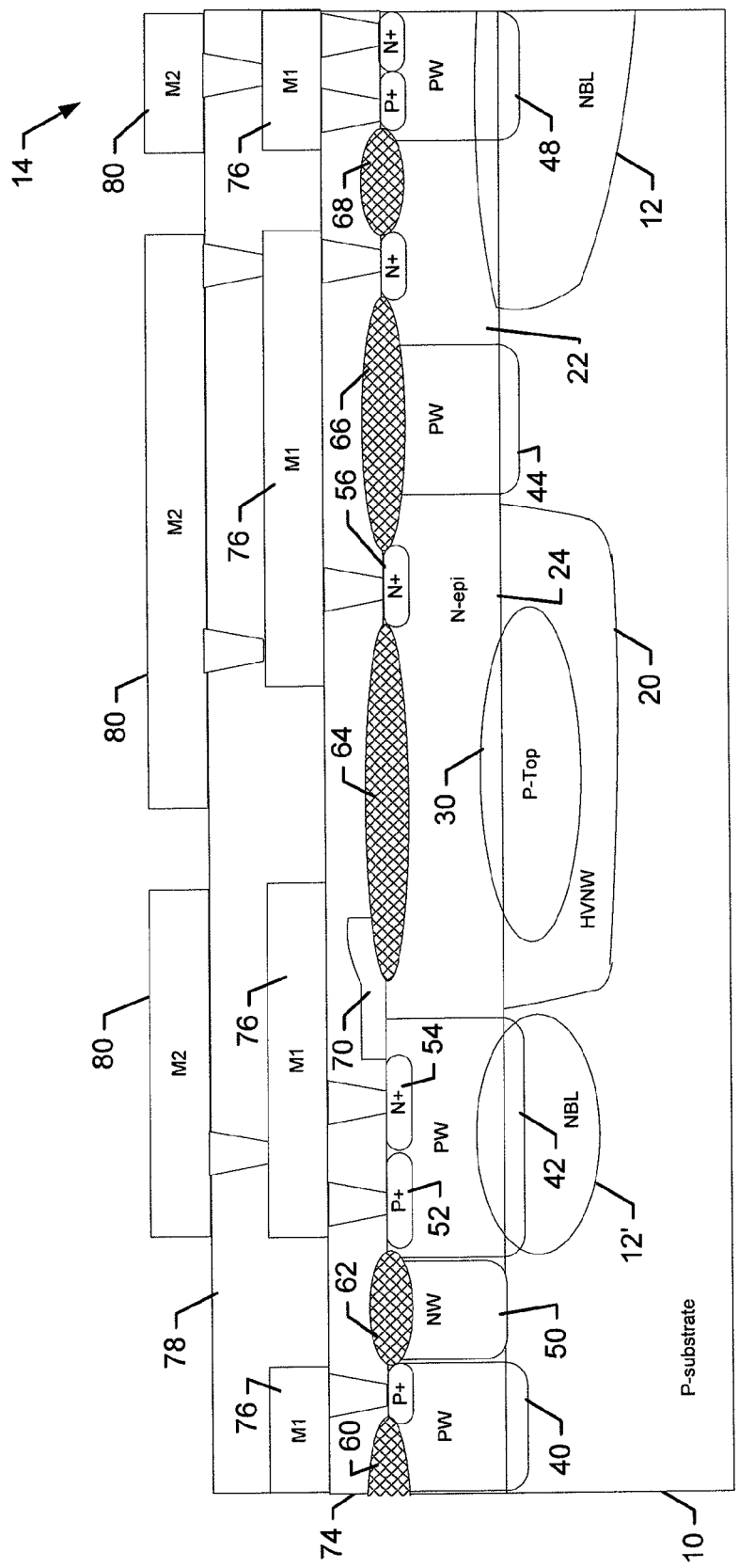
FIG. 8 illustrates an alternative structure in which an additional NBL is provided under the bulk and source PW according to an example embodiment.
Figure 9:
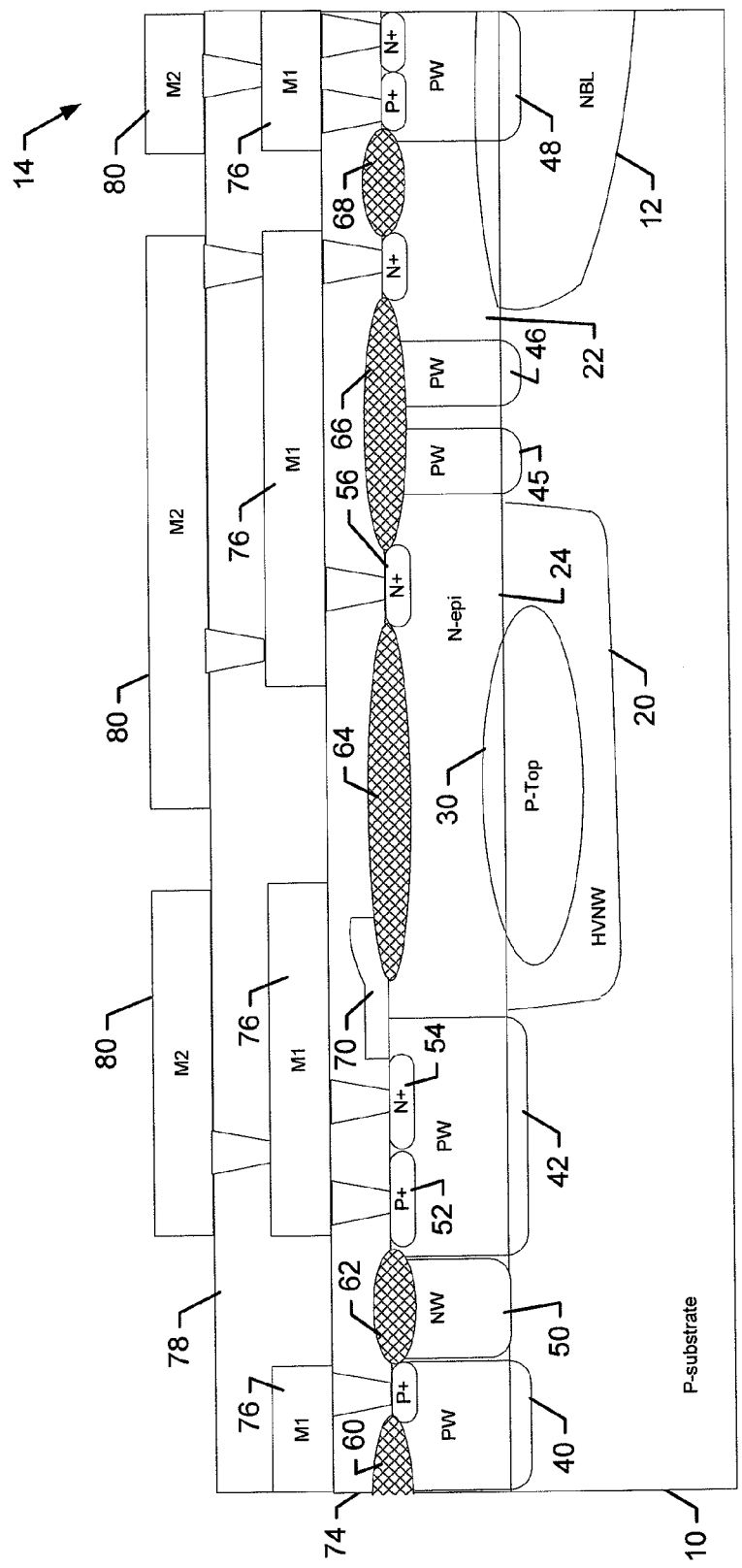
FIG. 9 illustrates an alternative structure in which a P-well (PW) disposed in a high-voltage (HV) interconnection region is split into two separate PWs spaced apart from each other according to an example embodiment.
Figure 10:
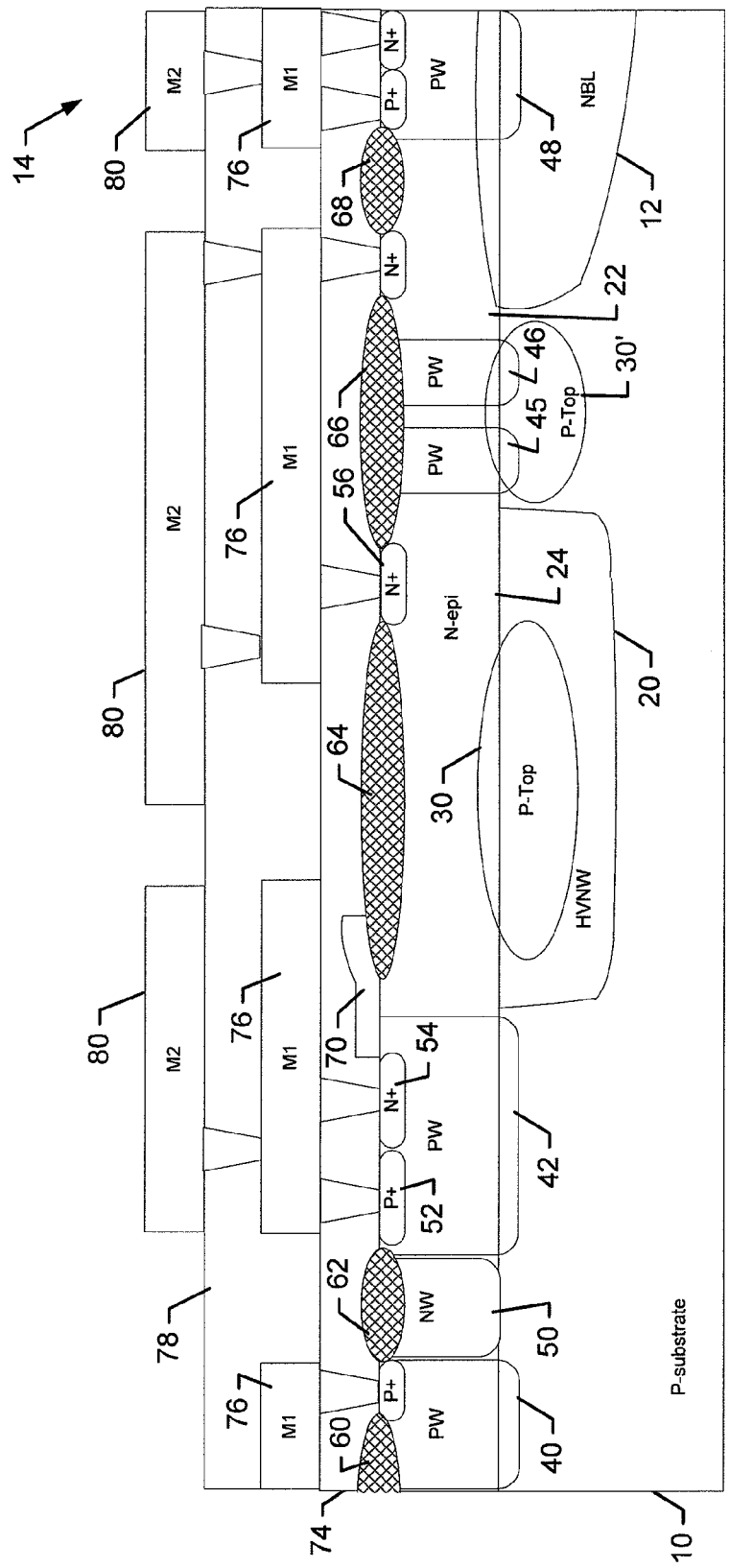
FIG. 10 illustrates an alternative structure in which the PWs of FIG. 9 have a P-Top layer disposed below them according to an example embodiment.
Figure 11:
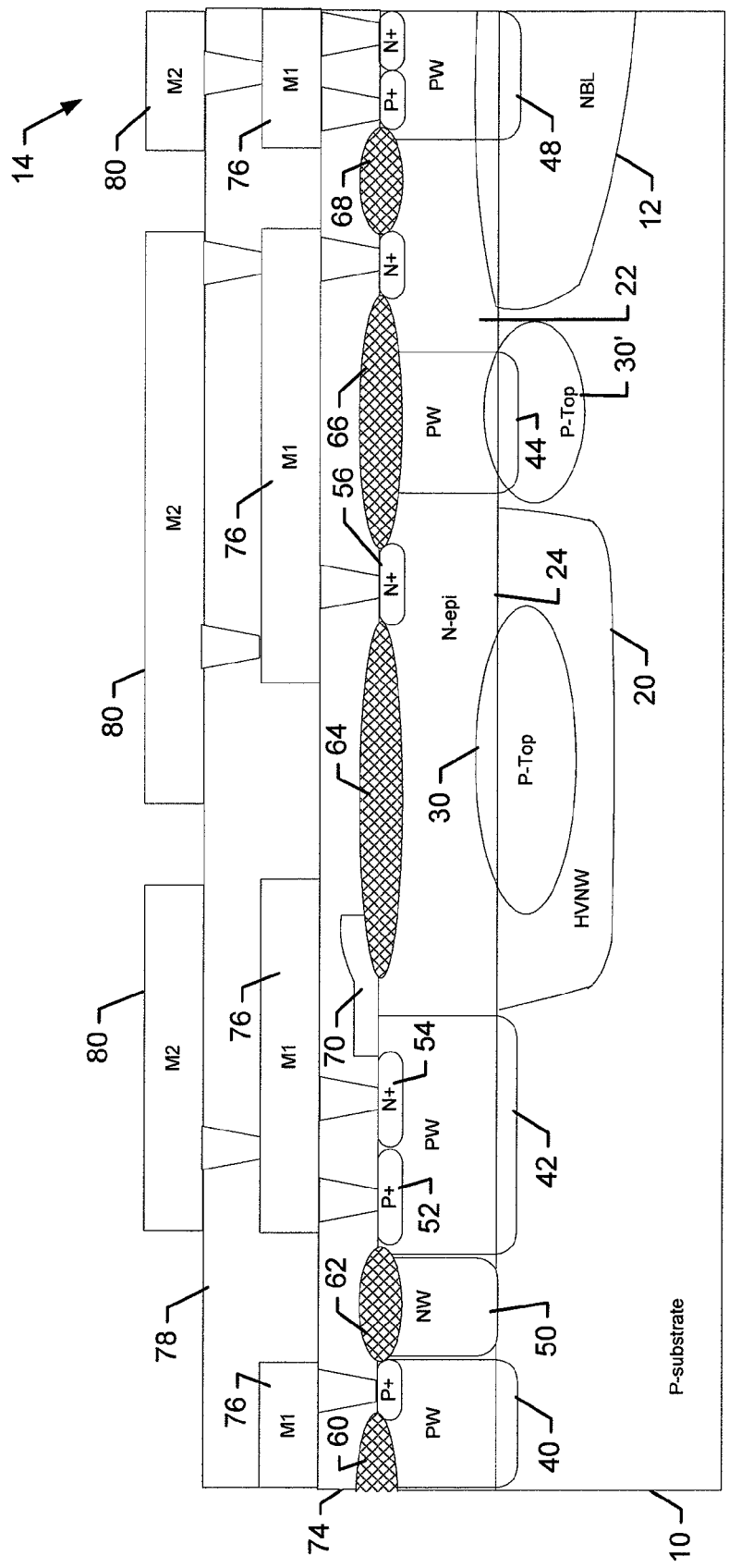
FIG. 11 illustrates an alternative structure in which the PW disposed in a high-voltage (HV) interconnection region has a P-Top layer disposed below it according to an example embodiment.

As shown in FIG. 6, instead of having two metal field plates for electrical connections (as is shown in the example embodiment of FIG. 1), some embodiments may only employ one metal field plate. In other alternative embodiments, the HVNW can be extended under the bulk and source PW as indicated by the HVNW layer 20' in FIG. 7. As yet another alternative, an additional NBL 12' may be provided under the bulk and source PW 42 as shown in FIG. 8. The additional NBL 12' or HVNW 20' may enable a further boost in the allowable source voltage. In still other examples, the PW disposed in the HV interconnection region (e.g., the high-voltage interconnection region PW 44 of FIG. 1) may be split into two PWs spaced apart from each other as shown in the example embodiment illustrated in FIG. 9. In this regard, PW 45 and PW 46 of FIG. 9 replace the PW 44 of FIG. 1. In some embodiments, an extra P-Top layer 30' may be inserted under the PWs 45 and 46 for additional self-shielding as shown in FIG. 10. In alternatives in which only a single PW is disposed in the high-voltage interconnection region (e.g., PW 44), the extra P-Top layer 30' may also be used as indicated in FIG. 11.

Figure 12:
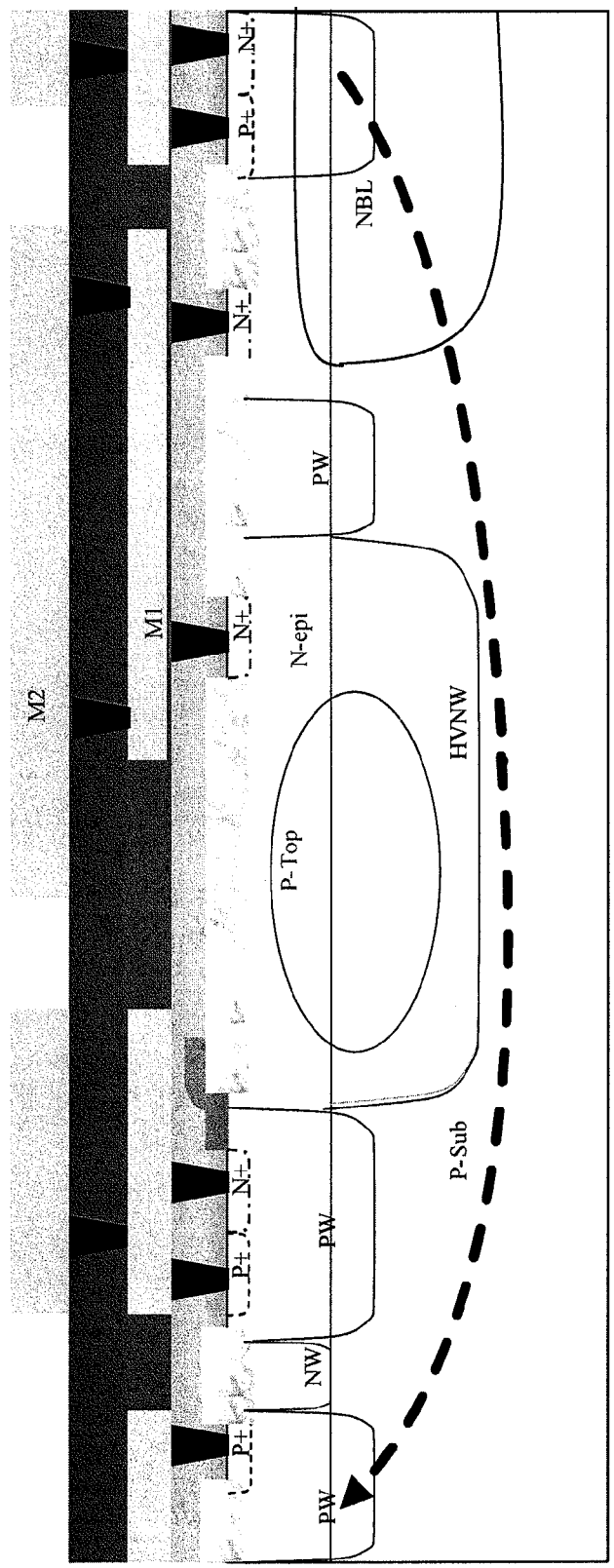
FIG. 12 shows how characteristics of features of example embodiments of the present invention provide isolation and self-shielding to avoid punch through between a high side and ground for a UHV NMOS constructed according to an example embodiment.

Example embodiments may provide numerous structural characteristics to assist in enabling sustained high-voltage operation. For example, some embodiments may utilize sufficient junction depth of the HVNW to sustain high-voltage operation. Using a relatively thin N-epi layer, self-shielding and isolation may be improved to enable the high-voltage operation of example embodiments. Furthermore, the PW in the high-voltage interconnection region may also assist in provision of self-shielding and isolation. In some embodiments, the P-Top layer may further support high-voltage operation and the NBL may prevent punch through from a high-voltage area to ground through the substrate (a leakage current path) that is inhibited by the NBL is shown as a dashed arrow in FIG. 12. FIG. 12 shows the high-side and ground for a UHV NMOS according to an example embodiment.

Figure 13:
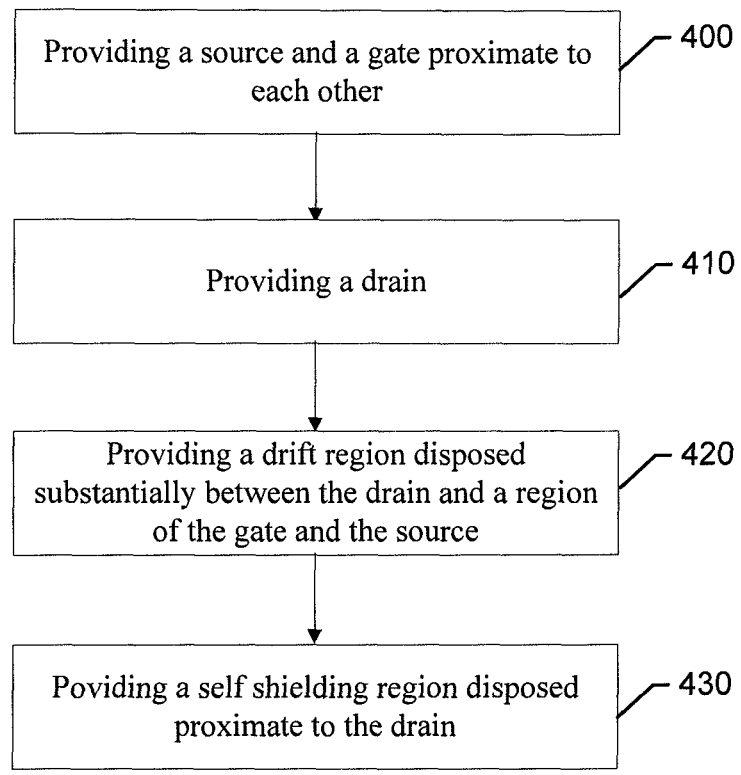
FIG. 13 illustrates operations associated with a method for providing an N-type metal-oxide-semiconductor device with an isolated structure for UHV operation according to an example embodiment of the present invention

FIG. 13 illustrates a flowchart for a method of forming a UHV NMOS according to an example embodiment. As shown in FIG. 13, the method may include providing a source and a gate proximate to each other at operation 400, providing a drain at operation 410, providing a drift region disposed substantially between the drain and a region of the gate and the source at operation 420, and providing a self shielding region disposed proximate to the drain at operation 430.

In an example embodiment, various modifications and/or additions to the method described above may also be implemented. The modifications and/or additions may each be added in connection with each other modification or addition or individually in different example embodiments. In some examples, the method may further include providing a substrate of P-type material and forming a high-voltage N-well (HVNW) region in a portion of the substrate to form the drift region. The method may further include forming an N-doped buried layer (NBL) in another portion of the substrate (spaced apart from the HVNW region) and forming a N-epi layer of epitaxially-grown N-type material over the substrate, the HVNW region and the NBL. In some cases the method may further include forming a bulk and source P-well (PW) bulk and source P-well (PW) at a portion of the N-epi layer that is adjacent to the portion of the N-epi layer that is proximate to the HVNW region, forming a gate to extend from the bulk and source PW to a field oxide film disposed over the portion of the N-epi layer that is proximate to the HVNW region, and forming a drain at a portion of the N-epi layer that is proximate to the HVNW region and is also adjacent to an opposite side of the field oxide film of that on which the gate is formed. In some embodiments, the method may further include forming a high-voltage interconnect region PW between the NBL and the portion of the N-epi layer that is proximate to the HVNW region. In an example embodiment, forming the high-voltage interconnect region PW may include forming two PWs in the N-epi spaced apart from each other. In some cases, the method may further include forming a P-Top layer proximate to the high-voltage interconnect region PW. In an example embodiment, forming the HVNW region may include forming the HVNW region to extend below the bulk and source P-well (PW). In some cases, forming the HVNW region may include forming the HVNW region to include a P-Top layer disposed in a portion thereof. In some embodiments, the method may further include forming a layer of inter-layer dielectric (ILD) material over the N-epi layer, and forming a first metal field plate over at least a portion of the layer of ILD material. In an exemplary embodiment, the method may further include disposing an inter-metal dielectric (IMD) layer between the first metal field plate and a second metal field plate. In some cases, the method may further include forming a second NBL proximate to the HVNW region, wherein a bulk and source P-well (PW) is disposed above the second NBL.

Some alternative embodiments of the present invention may provide an NMOS structure for UHV operation (e.g., greater than 650V) using P-epi instead of N-epi. In this regard, the structure provided by some example embodiments may include the use of an epitaxially-grown P-layer (P-epi). Some embodiments may also employ P-type material in a particular P-well (PW) configuration to provide isolation for both self shielding and isolation purposes. N-type material may also be employed in a high-voltage N-well (HVNW) to support sustained operation at UHV. In some embodiments, the HVNW may be applied in two layers. One HVNW layer may be set up before the P-epi layer is deposited, and the other HVNW layer may be deposited after the P-epi layer is deposited.

FIG. 14 illustrates a cross sectional view of a UHV NMOS device according to an example embodiment. The device may include a substrate 1010. In an example embodiment the substrate 1010 may be a P-substrate. In an example embodiment, the device may further include an N-doped buried layer (NBL) 1012 disposed at a high-side operating region 1014 of the substrate 1010. Among perhaps other things, the NBL 1012 may provide isolation functionality for the high side operating region 1014. The substrate 1010 may also include a first HVNW layer 1020 disposed within the substrate 1010. In an example embodiment, a P-epi layer 1022 may be disposed over the substrate 1010. A second HVNW layer 1024 may be disposed in the P-epi 1022 at a location that is proximate to the first HVNW layer 1020. The first and second HVNW layers 1020 and 1024 may provide an increased critical electrical field for prevention of breakdown at high operating voltages (e.g., greater than 650V).

In some embodiments, the first and second HVNW layers 1020 and 1024 may include a P-type top layer (P-Top) 1030 disposed thereat. The P-Top 1030 layer may reduce surface field prior to breakdown. The P-epi 1022 may have one or more P-wells (PWs) and/or N-wells (NWs) provided therein (such wells at various instances being referred to herein as well regions—e.g., PW regions). As shown in FIG. 14, for example, a PW 1040, a bulk and source PW 1042, a high-voltage interconnection region PW 1044 and a high-side operating region PW 1048 may be provided along with an NW 1050. In some cases, the high-voltage interconnection region PW 1044 may be split into two PWs (e.g., PW 1045 and PW 1046) to provide increased self shielding and isolation. In some embodiments, the PW regions may further include regions having higher doping concentrations of P-type or N-type material as indicated by the P+ and N+ regions, respectively. The P+ region of the bulk and source PW 1042 may correspond to a bulk 1052 of the device, while the N+ region of the bulk and source PW 1042 may correspond to the source 1054 of the device. Meanwhile, an N+ region disposed within the second HVNW layer 1024 may correspond to the drain 1056 of the device.

In an example embodiment, a plurality of field-oxide films (FOXs) may be disposed proximate to the P-epi 1022 (and/or any or all of the PWs, NWs, second HVNW layer 1024). In an example embodiment, a first FOX 1060 may be disposed proximate to a portion of the PW 1040, a second FOX 1062 may be disposed proximate to the NW 1050, and a third FOX 1064 may be disposed between the bulk and source PW 1042 and the N+ region corresponding to the drain 1056. A fourth FOX 1066 may be disposed proximate to the high-voltage interconnection region PW 1044, and a fifth FOX 1068 may be disposed between an N+ region disposed over the NBL 1012 and the high side operating region PW 1048.

In an example embodiment, a gate 1070 of the device may be formed between the source 1054 and the third FOX 1064.

The gate 1070 may extend over a portion of the bulk and source PW 1042 and the third FOX 1064. A region of the device extending between the bulk edge and the drain edge may define a UHV NMOS. The high-voltage interconnection region PW 1044 may provide isolation between the UHV NMOS and other components on the same substrate of a lateral HVIC or PIC defined by the device of FIG. 14.

In an example embodiment, an insulating layer 1074 may be deposited over the FOXs, and the PWs and NWs or portions of the P-epi 1022 that may be exposed. The insulating layer 1074 may have various electrodes (e.g., corresponding the bulk, source and drain) positioned therein. In some embodiments, a metallic layer 1076 may be deposited over selected portions of the insulating layer 1074. The metallic layer 1076 may be used to connect the UHV NMOS to various other components. Moreover, in some cases, the metallic layer 1076 may pass over the high-voltage interconnection region PW 1044 to provide interconnection between UHV NMOS and other components. The PW 1044 can provide self-shielding and isolation. In some example embodiments, another insulating layer 1078 may be deposited over the metallic layer 1076 and a second metallic layer 1080 may be provided over the insulating layer 1078.

Figure 15A:
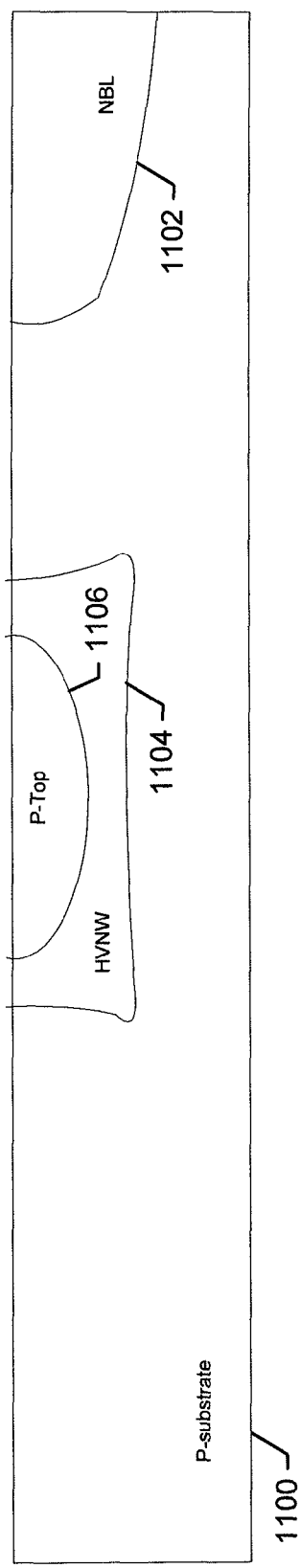

FIG. 15, which includes FIGS. 15A to 15D, illustrates the process flow for producing the device of FIG. 14 according to an example embodiment. As shown in FIG. 15A, a P-substrate 1100 may initially be provided, and an NBL 1102 may be formed in the P-substrate 1100, such as via photolithography and implantation processes. A first HVNW region 1104 may then be formed in a portion of the P-substrate 1100 that is spaced apart from the NBL 1102. The first HVNW region 1104 may also be formed via photolithography and implantation processes. In some embodiments, a P-Top region 1106 may then be formed within the first HVNW region 1104, such as via photolithography and implantation processes. In some instances, forming the NBL 1102 may be completed with a drive in process.

Figure 15B:
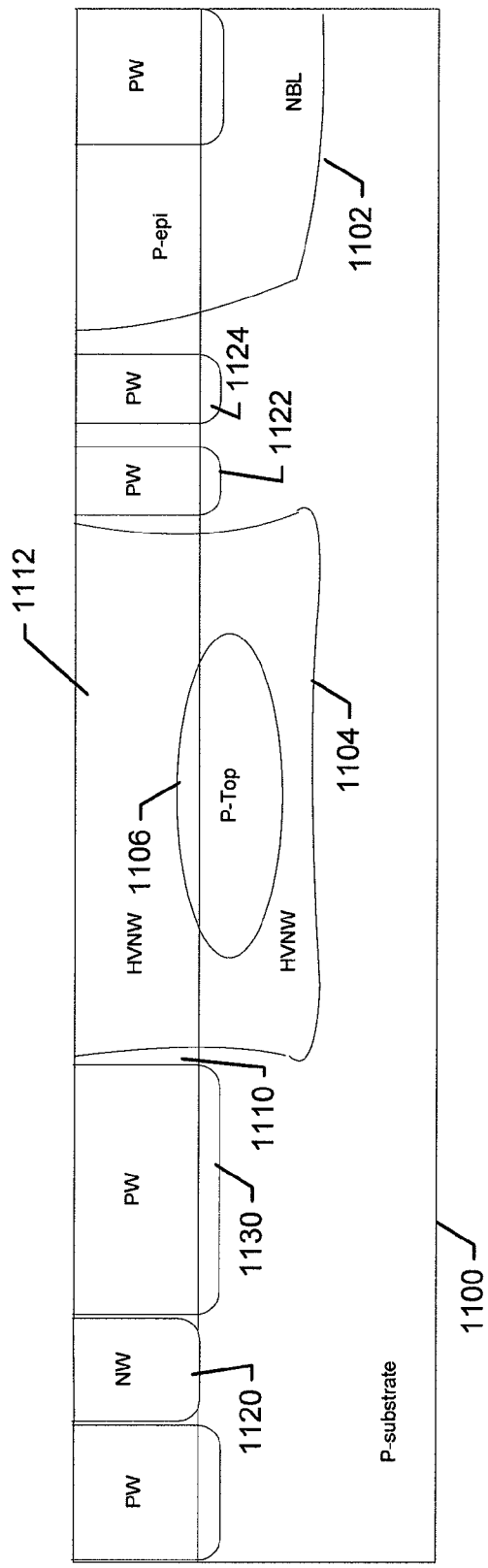

FIG. 15B illustrates a further progression of the process flow for producing the device of FIG. 14 according to an example embodiment. As shown in FIG. 15B, a P-epi layer 1110 may be deposited over the P-substrate 1100 (and the exposed portions of the first HVNW region 1104, the NBL 1102 and the P-Top region 1106). The P-epi layer 1110 may be epitaxially grown over the P-substrate 1100 and may thereafter have a second HVNW region 1112 formed therein at a portion of the P-epi layer 1110 that corresponds to the location of the first HVNW region 1104. The second HVNW region 1112 may be formed via photolithography and implantation processes. Following photolithography and implantation processes used to provide various PWs through the P-epi layer 1110, a drive in operation may be completed with respect to the second HVNW region 1112. An NW 1120 may also be provided in the P-epi layer 1110 via photolithography and implantation processes followed by a drive in operation.

The PWs that are provided in the P-epi layer 1110 may include a first PW 1122 and a second PW 1124 that are spaced apart from each other and disposed between the first and second HVNW regions 1104 and 1112 and the NBL 1102. The first and second PWs 1122 and 1124 may provide shielding and isolation in a high-voltage interconnection region of the device. Other PWs that may be provided in the P-epi layer 1110 may include a bulk and source PW 1130.

Figure 15C:
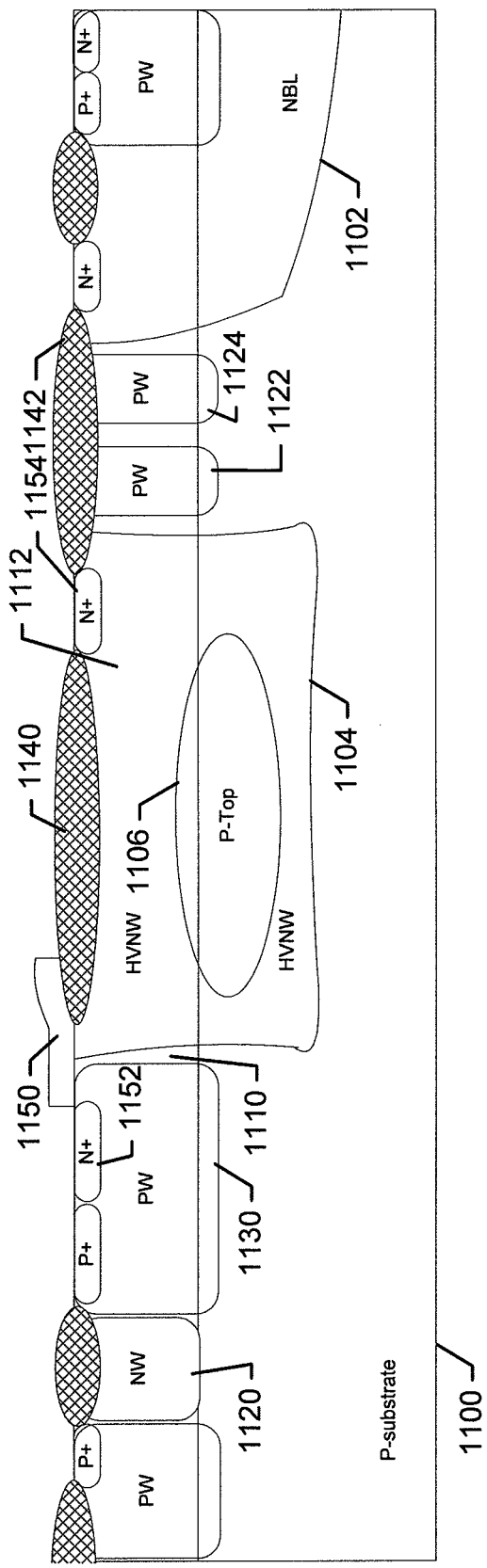

As shown in FIG. 15C, a plurality of FOX films may be grown at locations corresponding to various ones of the regions described above. The FOX films may be grown at their respective locations while employing photolithography techniques. In an example embodiment, among the FOX films grown, a first FOX 1140 may be grown over a portion of the second HVNW region 1112, and a second FOX 1142 may be grown over the first and second PW 1122 and 1124. A polysilicon layer may be deposited over the top of the exposed portions and then all but a portion of the polysilicon layer that extends from the bulk and source PW 1130 to the first FOX 1140 may be removed via photolithography techniques in order to form a gate 1150. Thereafter, further photolithography techniques and implantation may be undertaken to introduce N-type and P-type dopants of different concentrations into various portions of the P-epi layer 1110, the PWs and the second HVNW region 1112. For example, the bulk and source PW 1130 may have P and N-doped regions formed therein to define a bulk and source 1152, respectively. Meanwhile, the exposed portion of the second HVNW region 1112 that is between the first FOX 1140 and the second FOX 1142 may be formed with an N-doped region to define the drain 1154.

Figure 15D:
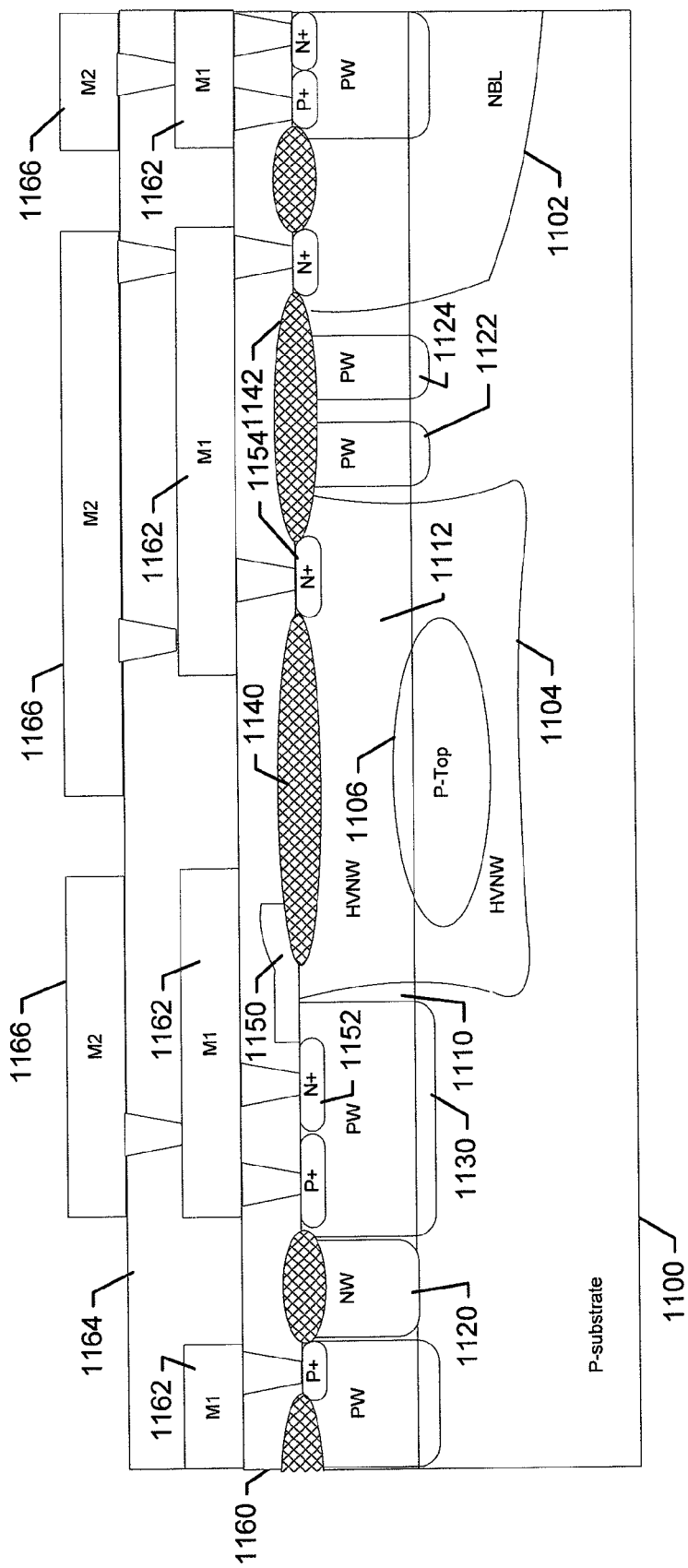

As shown in FIG. 15D, an inter-layer dielectric (ILD) material 1160 may be deposited over the exposed FOX films, the gate 1150, bulk and source 1152, drain 1154, first and second PWs 1122 and 1124 and other exposed items. The contacts may be included in the ILD material 1160 corresponding to the bulk and source 1152, the drain 1154 and various other components. The ILD material 1160 may then be covered with a first metallic layer 1162. Portions of the first metallic layer 1162 may then be removed using photolithography techniques to form interconnect lines where desired. Thereafter, an inter-metal dielectric (IMD) layer 1164 may be formed with contacts provided as appropriate. A second metallic layer 1166 may then be formed over the IMD layer 1164, and portions of the second metallic layer 1166 may be removed using photolithography techniques to again form interconnect lines where desired.

FIG. 16 provides an illustration of doping concentrations for the materials used in an example embodiment and highlighting four specific areas within the device of FIG. 14. FIG. 17, which includes FIGS. 17A to 17D, shows more detailed profiles of doping concentrations at each respective area labeled as profile 1, profile 2, profile 3 and profile 4, respectively. In this regard, FIG. 17A corresponds to profile 1 on FIG. 16, FIG. 17B corresponds to profile 2 on FIG. 16, FIG. 17C corresponds to profile 3 on FIG. 16, and FIG. 17D corresponds to profile 4 on FIG. 16.

FIG. 18 illustrates a top view of a device layout of an example embodiment. As indicated above, a lateral structure may allow the use of different types and/or multiple numbers of lateral devices to be implemented on the same substrate so long as effective electrical isolation is provided. Example embodiments of the present invention may provide sufficient isolation to enable sustained operation at very high voltages (e.g., greater than 650V) on the high side. Accordingly, as shown in FIG. 18, a device with multiple MOS devices, including perhaps both high-voltage MOS (HVMOS) and low-voltage MOS (LVMOS) devices, may be provided on the same substrate.

As shown in FIG. 18, three MOS devices (which could be any combinations of HVMOS and LVMOS) may be provided on the same substrate. It should be noted that embodiments could also provide other devices (e.g., LVMOS, bipolar junction transistors (BJTs) capacitors, resistors, etc.) in the HV area. Each of the devices has a corresponding gate G, drain D, and a source and bulk S & B. HVNW areas (which may include two layers laid down as described above) are indicated below each respective gate G and drain D region. In some cases, the NBL may also be set up in the HVNW area. However, a separate NBL region 1200 is also shown in FIG.

18. Metal may be formed over portions of the device, as described above, in order to provide for any connection lines that may be needed for a particular implementation. A PW isolation region 1210 is for self-shielding (corresponding, in some examples, to the first and second PWs 1122 and 1124 of FIG. 15). Other PW portions 1220 are also indicated and may be employed for grounding. In an exemplary embodiment, the larger portion of the device that is outlined in dashed lines (depicted on the right side in FIG. 18) may be provided for high current request.

Example embodiments like those described above may enable the formation of multiple components on the same substrate with UHV operation. However, embodiments of the present invention are not limited to those specifically described above. Instead, those of skill in the art will appreciate that various modifications to the examples described above may be applied without departing from the spirit and scope of embodiments of the present invention. FIGS. 19-22 show some alternative structures that may be employed in connection with example embodiments of the present invention.

As shown in FIG. 19, instead of having two metal field plates for electrical connections (as is shown in the example embodiment of FIG. 14), some embodiments may only employ one metal field plate. In other alternative embodiments, the HVNW can be extended under the bulk and source PW as indicated by the first HVNW layer 1020' in FIG. 20. As yet another alternative, an additional NBL 1012' may be provided under the bulk and source PW 1042 as shown in FIG. 21. In still other examples, the PW disposed in the HV interconnection region (e.g., the high-voltage interconnection region PW 1044 of FIG. 14) may be eliminated as shown in the example embodiment illustrated in FIG. 22.

Example embodiments may provide numerous structural characteristics to assist in enabling sustained high-voltage operation. For example, some embodiments may utilize sufficient junction depth of the HVNW to sustain high-voltage operation. The sufficient depth of HVNW may be provided by forming a first HVNW layer prior to depositing the P-epi layer, and then forming the additional HVNW layer. As such, the P-epi may assist in the provision of self-shielding and isolation that enables the high-voltage operation of example embodiments. Furthermore, the PW in the high-voltage interconnection region may also assist in provision of self-shielding and isolation. In some embodiments, the P-Top layer may further support high-voltage operation and the NBL may prevent punch through from a high-voltage area to ground through the substrate. FIG. 23 shows the high-side and ground for a UHV NMOS according to an example embodiment. In some embodiments, the high side area may further include an HVNW region. For example, FIG. 24 illustrates an alternative structure similar to that of FIG. 15D except that an HVNW 1105 is set up in the high side area. As yet another example, FIG. 25 illustrates an alternative embodiment in which another HVNW is set up in the high side over the NBL 1102' while another NBL 1112' is provided as well.

Accordingly, referring back to FIG. 13, an alternative method may include providing a substrate of P-type material, and forming a first high-voltage N-well (HVNW) region in a portion of the substrate to form the drift region. The method may further include forming an N-doped buried layer (NBL) in another portion of the substrate and forming a P-epi layer of epitaxially-grown P-type material over the substrate, the first HVNW region and the NBL. The method may also include forming a second HVNW region in the P-epi layer proximate to the first HVNW region. In some cases the method may further include forming a bulk and source P-well (PW) proximate to the first and second HVNW regions, forming a gate to extend from the bulk and source PW to a field oxide film formed over a portion of the second HVNW region, and forming a drain at a portion of the second HVNW region that is adjacent to an opposite side of the field oxide film of that on which the gate is formed. In some examples, the method may further include forming a high-voltage interconnect region PW between the NBL and the first and second HVNW regions. In some cases, forming the high-voltage interconnect region PW may include forming two PWs spaced apart from each other in the P-epi and/or forming a P-Top layer in the first HVNW region. In an example embodiment, the method may further include forming a layer of inter-layer dielectric (ILD) material over the P-epi layer, and forming a first metal field plate over at least a portion of the layer of ILD material. Some embodiments may further include an operation of forming an inter metal dielectric (IMD) layer disposed between the first metal field plate and a second metal field plate. In some cases, the method may include forming a bulk and source P-well (PW) in the first and second HVNW regions or forming a second NBL proximate to the first HVNW region and forming a bulk and source P-well (PW) proximate to the first and second HVNW regions and above the second NBL.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A high-voltage metal-oxide-semiconductor (HVMOS) device comprising:
  a substrate;
  a source;
  a drain;
  a gate positioned proximate to the source;
  a drift region disposed substantially between the drain and a region of the gate and the source, the drift region having a P-Top layer disposed in a portion thereof;
  a high-voltage N-well (HVNW) region disposed in a portion of the substrate to form the drift region, at least a part of the P-Top layer disposed in the HVNW region; and
  a self shielding region disposed proximate to the drain and the P-Top layer disposed proximate to the self shielding region.

2. The HVMOS device of claim 1, wherein the self shielding region comprises two PWs disposed in a N-epi layer of epitaxially-grown N-type material spaced apart from each other.

3. The HVMOS device of claim 1, further comprising:
  a substrate of P-type material;
  a first N-doped buried layer (NBL) disposed in a portion of the substrate spaced apart from the HVNW region; and a N-epi layer of epitaxially-grown N-type material disposed over the substrate, the HVNW region and the first NBL.

4. The HVMOS device of claim 3, wherein a bulk and source P-well (PW) is disposed at a portion of the N-epi layer that is adjacent to the portion of the N-epi layer that is proximate to the HVNW region, wherein the gate is disposed to extend from the bulk and source PW to a field oxide film disposed over the portion of the N-epi layer that is proximate to the HVNW region, and wherein the drain is disposed at a portion of the N-epi layer that is proximate to the HVNW region and is also adjacent to an opposite side of the field oxide film of that on which the gate is formed.

5. The HVMOS device of claim 4, wherein the self shielding region comprises a high-voltage interconnect region PW disposed between the first NBL and the portion of the N-epi layer that is proximate to the HVNW region.

6. The HVMOS device of claim 5, wherein the P-Top layer is disposed proximate to the high-voltage interconnect region PW.

7. The HVMOS device of claim 4, wherein the HVNW layer is disposed to extend below the bulk and source P-well (PW).

8. The HVMOS device of claim 3, further comprising a second NBL disposed proximate to the HVNW region, wherein a bulk and source P-well (PW) is disposed above the second NBL.

9. The HVMOS device of claim 1, further comprising:
a substrate of P-type material;
a first HVNW region, wherein the first HVNW region is the HVNW region;
a first N-doped buried layer (NBL) disposed in another portion of the substrate;
a P-epi layer of epitaxially-grown P-type material disposed over the substrate, the first HVNW region and the first NBL; and
a second HVNW region disposed in the P-epi layer proximate to the first HVNW region.

10. The HVMOS device of claim 9, wherein a bulk and source P-well (PW) is formed proximate to the first and second HVNW regions, wherein the gate is disposed to extend from the bulk and source PW to a field oxide film disposed over a portion of the second HVNW region, and wherein the drain is disposed at a portion of the second HVNW region that is adjacent to an opposite side of the field oxide film of that on which the gate is formed.

11. The HVMOS device of claim 10, wherein the self shielding region comprises a high-voltage interconnect region PW disposed between the first NBL and the first and second HVNW regions.

12. The HVMOS device of claim 9, further comprising a second NBL disposed proximate to the first HVNW region, wherein a bulk and source P-well (PW) is disposed proximate to the first and second HVNW regions and above the second NBL.

13. The HVMOS device of claim 1, further comprising:
a layer of inter-layer dielectric (ILD) material disposed over the gate, the source and the drain; and
a first metal field plate disposed over at least a portion of the layer of ILD material.

14. The HVMOS device of claim 13, further comprising an inter-metal dielectric (IMD) layer disposed between the first metal field plate and a second metal field plate.

15. A method of forming a high-voltage metal-oxide-semiconductor (HVMOS) device comprising:
providing a substrate;
providing a source and a gate proximate to each other;
providing a drain;
providing a drift region disposed substantially between the drain and a region of the gate and the source, the drift region having a P-Top layer disposed in a portion thereof;
forming a high-voltage N-well (HVNW) region in a portion of the substrate to form the drift region, at least a part of the P-Top layer disposed in the HVNW region; and
providing a self shielding region disposed proximate to the drain and the P-Top layer disposed proximate to the self shielding region.

16. The method of claim 15, further comprising:
providing a substrate of P-type material;
forming a first N-doped buried layer (NBL) in a portion of the substrate spaced apart from the HVNW region; and
forming a N-epi layer of epitaxially-grown N-type material over the substrate, the HVNW region and the first NBL.

17. The method of claim 16, further comprising forming a bulk and source P-well (PW) bulk and source P-well (PW) at a portion of the N-epi layer that is adjacent to the portion of the N-epi layer that is proximate to the HVNW region, forming the gate to extend from the bulk and source PW to a field oxide film disposed over the portion of the N-epi layer that is proximate to the HVNW region, and forming the drain at a portion of the N-epi layer that is proximate to the HVNW region and is also adjacent to an opposite side of the field oxide film of that on which the gate is formed.

18. The method of claim 17, further comprising forming the self shielding region as a high-voltage interconnect region PW between the first NBL and the HVNW region.

19. The method of claim 15, further comprising:
providing a substrate of P-type material;
forming a first N-doped buried layer (NBL) in another portion of the substrate;
forming a P-epi layer of epitaxially-grown P-type material over the substrate, a first HVNW region and the first NBL, wherein the first HVNW region is the HVNW region; and
forming a second HVNW region in the P-epi layer proximate to the first HVNW region.

20. The method of claim 19, further comprising forming a bulk and source P-well (PW) proximate to the first and second HVNW regions, forming the gate to extend from the bulk and source PW to a field oxide film formed over a portion of the second HVNW region, and forming the drain at a portion of the second HVNW region that is adjacent to an opposite side of the field oxide film of that on which the gate is formed.

21. The method of claim 20, further comprising forming the self shielding region as a high-voltage interconnect region PW between the first NBL and the first and second HVNW regions.

* * * * *